(12) United States Patent
Kim et al.

(10) Patent No.: US 12,707,868 B2
(45) Date of Patent: Aug. 11, 2026

(54) DISPLAY PANEL

(71) Applicant: Samsung Display Co., Ltd., Yongin-si (KR)

(72) Inventors: Jeongki Kim, Hwaseong-si (KR); Hakbum Choi, Cheonan-si (KR); Seok-Joon Hong, Seongnam-si (KR); Myoungjong Lee, Cheonan-si (KR); Sujin Lee, Hwaseong-si (KR); Si-Wan Jeon, Hwaseong-si (KR); Tae Hyung Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 686 days.

(21) Appl. No.: 18/096,489

(22) Filed: Jan. 12, 2023

(65) Prior Publication Data

US 2023/0255093 A1 Aug. 10, 2023

(30) Foreign Application Priority Data

Jan. 20, 2022 (KR) ........................ 10-2022-0008781

(51) Int. Cl.

*H10K 59/80* (2023.01)
*H10K 59/12* (2023.01)
*H10K 59/38* (2023.01)

(52) U.S. Cl.

CPC ........... *H10K 59/879* (2023.02); *H10K 59/38* (2023.02); *H10K 59/12* (2023.02)

(58) Field of Classification Search

CPC ....... H10K 59/879; H10K 59/38; H10K 59/12
USPC .......................................................... 313/500
See application file for complete search history.

(56) References Cited

U.S. PATENT DOCUMENTS 10,510,973 B2 12/2019 Yamamoto et al.
10,593,842 B2 3/2020 Kim et al.
11,158,683 B2 10/2021 Ahn et al.
11,251,408 B2 2/2022 Bae et al.
2019/0067643 A1* 2/2019 Zhai .................. H10K 59/8731
2020/0279851 A1* 9/2020 Endo .................... H10D 86/423

(Continued)

FOREIGN PATENT DOCUMENTS

KR 10-2016-0073906 A 6/2016
KR 10-2018-0003287 A 1/2018

(Continued)

*Primary Examiner* — James R Greece
*Assistant Examiner* — Hana S Featherly
(74) *Attorney, Agent, or Firm* — Womble Bond Dickinson (US) LLP

(57) ABSTRACT

A display panel includes a light emitting element that outputs source light and that includes a first electrode, an emissive layer over the first electrode, and a second electrode over the emissive layer and a light control layer over the light emitting element. The light control layer includes at least one light control pattern and a barrier layer that is on one surface of the light control pattern and that contains silicon oxy-nitride (SiON). The barrier layer contains 0.1 atomic % to 18 atomic % nitrogen, 42 atomic % to 70 atomic % oxygen, and 25 atomic % to 45 atomic % silicon. Accordingly, the durability and barrier characteristics of the barrier layer and the light conversion efficiency of the light control pattern may be improved, and thus the reliability and display efficiency of the display panel including the barrier layer and the light control pattern may be enhanced.

20 Claims, 9 Drawing Sheets

(56) References Cited

U.S. PATENT DOCUMENTS

| | | | |
|---|---|---|---|
| 2020/0373359 | A1 | 11/2020 | Lee et al. |
| 2021/0217816 | A1 | 7/2021 | Ha et al. |

FOREIGN PATENT DOCUMENTS

| | | | |
|---|---|---|---|
| KR | 10-2018-0052161 | A | 5/2018 |
| KR | 10-2020-0117093 | A | 10/2020 |
| KR | 10-2020-0128287 | A | 11/2020 |
| KR | 10-2020-0135130 | A | 12/2020 |
| KR | 10-2021-0091384 | A | 7/2021 |
| KR | 10-2021-0095283 | A | 8/2021 |

* cited by examiner

FIG. 1C

DP
DA
NDA
PXnm
DLm
GL1
GLn
PX11
DL1
GDC
DR1
DR2
DR3

FIG. 2C

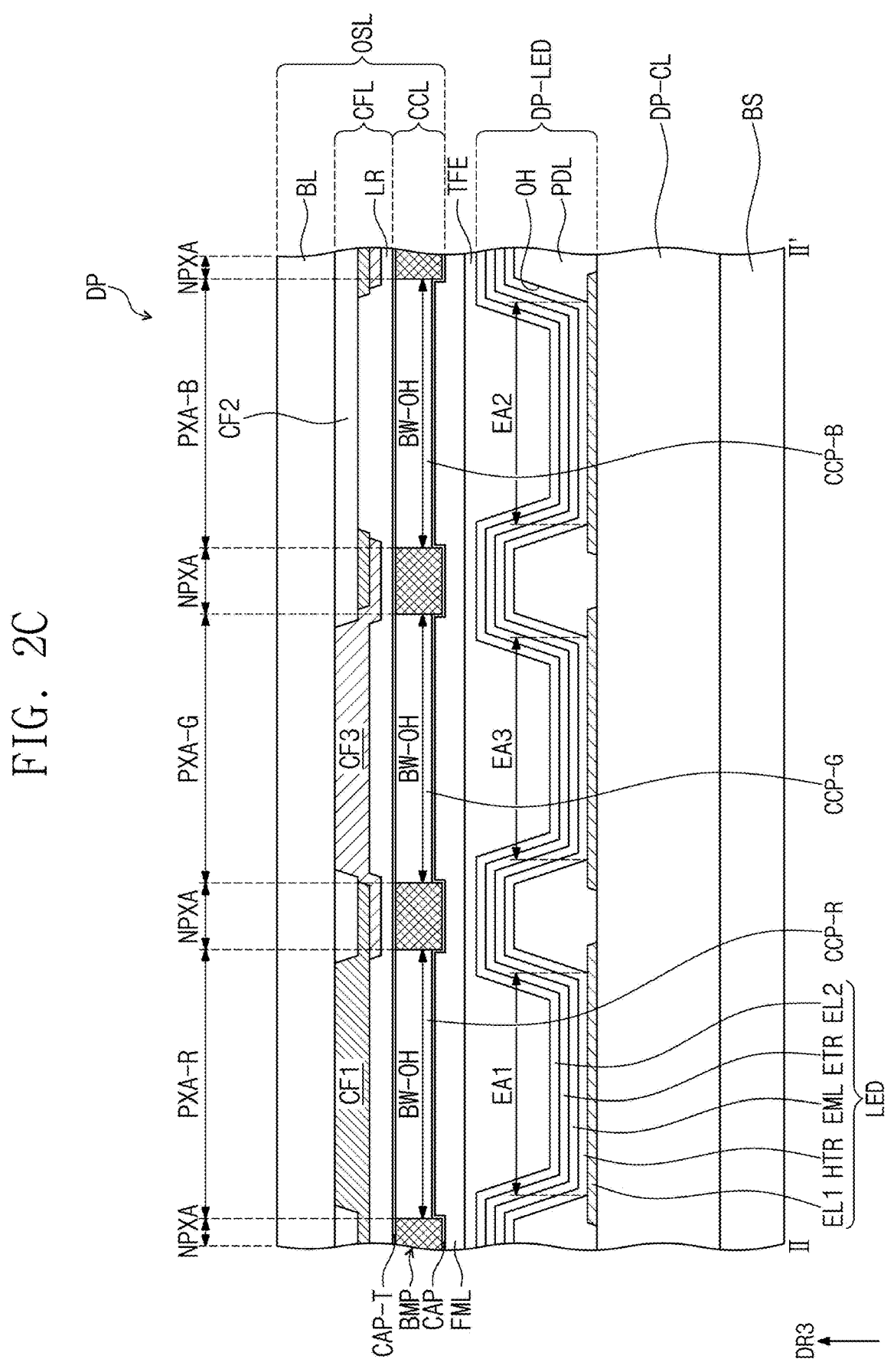

DP OSL CFL CCL DP-LED DP-CL BS BL LR TFE OH PDL NPXA PXA-B CF2 BW-OH EA2 CCP-B PXA-G CF3 EA3 CCP-G PXA-R CF1 EA1 CCP-R EL1 HTR EML ETR EL2 LED II II' CAP-T BMP CAP FML DR3

DISPLAY PANEL

CROSS-REFERENCE TO RELATED APPLICATIONS

This application claims priority to and the benefit of Korean Patent Application No. 10-2022-0008781, filed on Jan. 20, 2022, in the Korean Intellectual Property Office, the disclosure of which is incorporated by reference herein in its entirety.

BACKGROUND

1. Field

Embodiments of the present disclosure described herein relate to a display panel, and for example, relate to a display panel having improved durability and reliability and increased display efficiency.

2. Description of the Related Art

A display panel includes: a transmissive display panel that selectively transmits source light generated from a light source; and an emissive display panel that generates source light by itself. The display panel may include different types (kinds) of light control patterns depending on pixels to generate a color image. The light control patterns may transmit only a partial wavelength range of source light, or may convert the color of the source light. Some of the light control patterns may change characteristics of the light without changing the color of the source light.

SUMMARY

Aspects of embodiments of the present disclosure are directed toward a display panel having improved durability and display efficiency.

Additional aspects will be set forth in part in the description which follows and, in part, will be apparent from the description, or may be learned by practice of the presented embodiments of the disclosure.

According to an embodiment, a display panel includes a light emitting element that outputs source light and that includes a first electrode, an emissive layer disposed over the first electrode, and a second electrode disposed over the emissive layer and a light control layer disposed over the light emitting element. The light control layer includes at least one light control pattern and a barrier layer that is disposed on one surface of the at least one light control pattern and that contains silicon oxy-nitride (SiON). The barrier layer contains 0.1 atomic % to 18 atomic % nitrogen, 42 atomic % to 70 atomic % oxygen, and 25 atomic % to 45 atomic % silicon.

The barrier layer may have a refractive index of 1.4 to 1.8.

A difference between a refractive index of the barrier layer and a refractive index of the light control pattern may be less than or equal to 0.25.

The barrier layer may have a thickness of 2000 Å to 12000 Å.

The barrier layer may be disposed between the light emitting element and the light control pattern.

The display panel may further include an additional barrier layer disposed to be spaced apart from the light emitting element with the light control pattern therebetween. The additional barrier layer may contain silicon oxy-nitride.

The display panel may further include a color filter layer that is disposed over the light control layer and that includes at least one color filter that overlaps the at least one light control pattern.

The color filter layer may further include a low refractive index layer disposed between the light control pattern and the color filter. The low refractive index layer may have a refractive index of 1.3 or less.

The display panel may further include a filling layer disposed between the light emitting element and the light control layer.

The barrier layer may include a first sub-barrier layer containing silicon oxy-nitride and containing 0.1 atomic % to 18 atomic % nitrogen, 42 atomic % to 70 atomic % oxygen, and 25 atomic % to 45 atomic % silicon and a second sub-barrier layer disposed between the first sub-barrier layer and the light control pattern.

The light control pattern may include a first light control pattern that converts the source light into first light and a second light control pattern that transmits the source light, and the first light control pattern may contain a first quantum dot that converts the source light into the first light.

The light control pattern is provided in plurality. The light control layer may further include a bank disposed between the light control patterns.

The barrier layer may be directly disposed on the one surface of each of the light control patterns and one surface of the bank.

The light emitting element may include a plurality of light emitting stacks disposed between the first electrode and the second electrode, each light emitting stack including the emissive layer.

The plurality of light emitting stacks may include a first light emitting stack that is disposed on the first electrode and that includes a first emissive layer, a charge generation layer disposed on the first light emitting stack, and a second light emitting stack that is disposed on the charge generation layer and that includes a second emissive layer, and the first emissive layer may emit light having a different color from light emitted from the second emissive layer.

According to an embodiment, a display panel includes a light emitting element that outputs source light and that includes a first electrode, an emissive layer disposed over the first electrode, and a second electrode disposed over the emissive layer and a light control layer disposed over the light emitting element. The light control layer includes at least one light control pattern and a barrier layer that is disposed on at least one surface of the light control pattern and that contains silicon oxy-nitride (SiON). In the barrier layer, a ratio of oxygen atoms to silicon atoms ranges from 1.0 to 2.0, and the barrier layer has a refractive index of 1.4 to 1.8.

The barrier layer may have a thickness of 2000 Å to 12000 Å.

According to an embodiment, a display panel includes a lower panel including a display element layer and an encapsulation layer disposed on the display element layer, an upper panel disposed over the lower panel, and a filling layer disposed between the lower panel and the upper panel. The upper panel includes a light control layer disposed on the filling layer. The light control layer includes at least one light control pattern and a barrier layer that is disposed on at least one surface of the light control pattern and that contains silicon oxy-nitride (SiON). In the barrier layer, a ratio of oxygen atoms to silicon atoms ranges from 1.0 to 2.0, and a difference between a refractive index of the barrier layer and a refractive index of the light control pattern is less than or equal to 0.25.

The filling layer may have a refractive index of 1.45 to 1.9.

A difference between the refractive index of the barrier layer and a refractive index of the filling layer may be less than or equal to 0.1.

BRIEF DESCRIPTION OF THE DRAWINGS

The above and other objects and features of the present disclosure will become apparent by describing in more detail embodiments thereof with reference to the accompanying drawings.

FIG. 1C is a plan view of the display panel according to an embodiment of the present disclosure.

FIG. 2C is an enlarged view of a partial area of a section of the display panel according to an embodiment of the present disclosure.

DETAILED DESCRIPTION

Figure 1A:
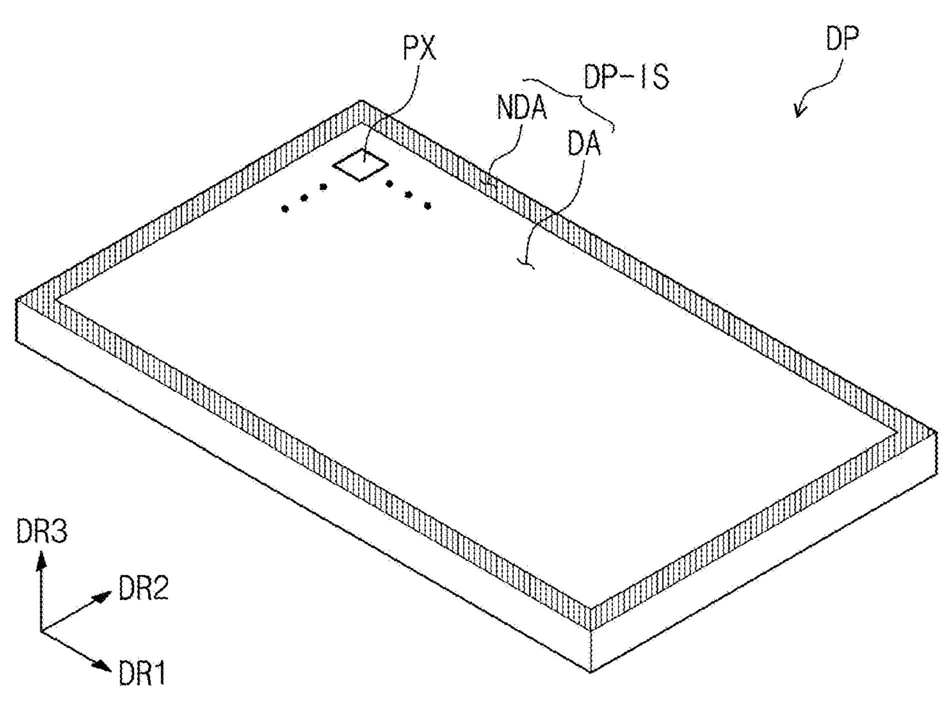
FIG. 1A is a perspective view of a display panel according to an embodiment of the present disclosure.

Hereinafter, embodiments of the present disclosure will be described with reference to the accompanying drawings.

In this specification, when it is mentioned that a component (or, an area, a layer, a part, etc.) is referred to as being "on", "connected to" or "coupled to" another component, this refers to that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and/or the like may be used to describe one or more suitable components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In some embodiments, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

The expression "directly disposed" used herein may refer to that there is no additional layer, film, area, or plate between one portion, such as a layer, a film, an area, or a plate, and another portion. For example, the expression "directly disposed" may refer to that two layers or two members are disposed without an additional member such as an adhesive member therebetween.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, a display panel according to an embodiment of the present disclosure will be described with reference to the accompanying drawings.

Figure 1B:
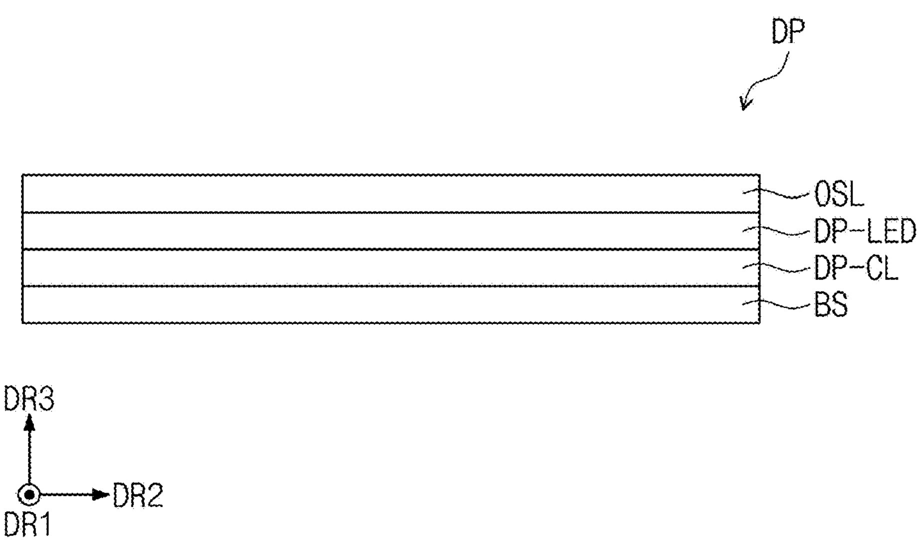
FIG. 1B is a sectional view of the display panel according to an embodiment of the present disclosure.
Figure 1C:
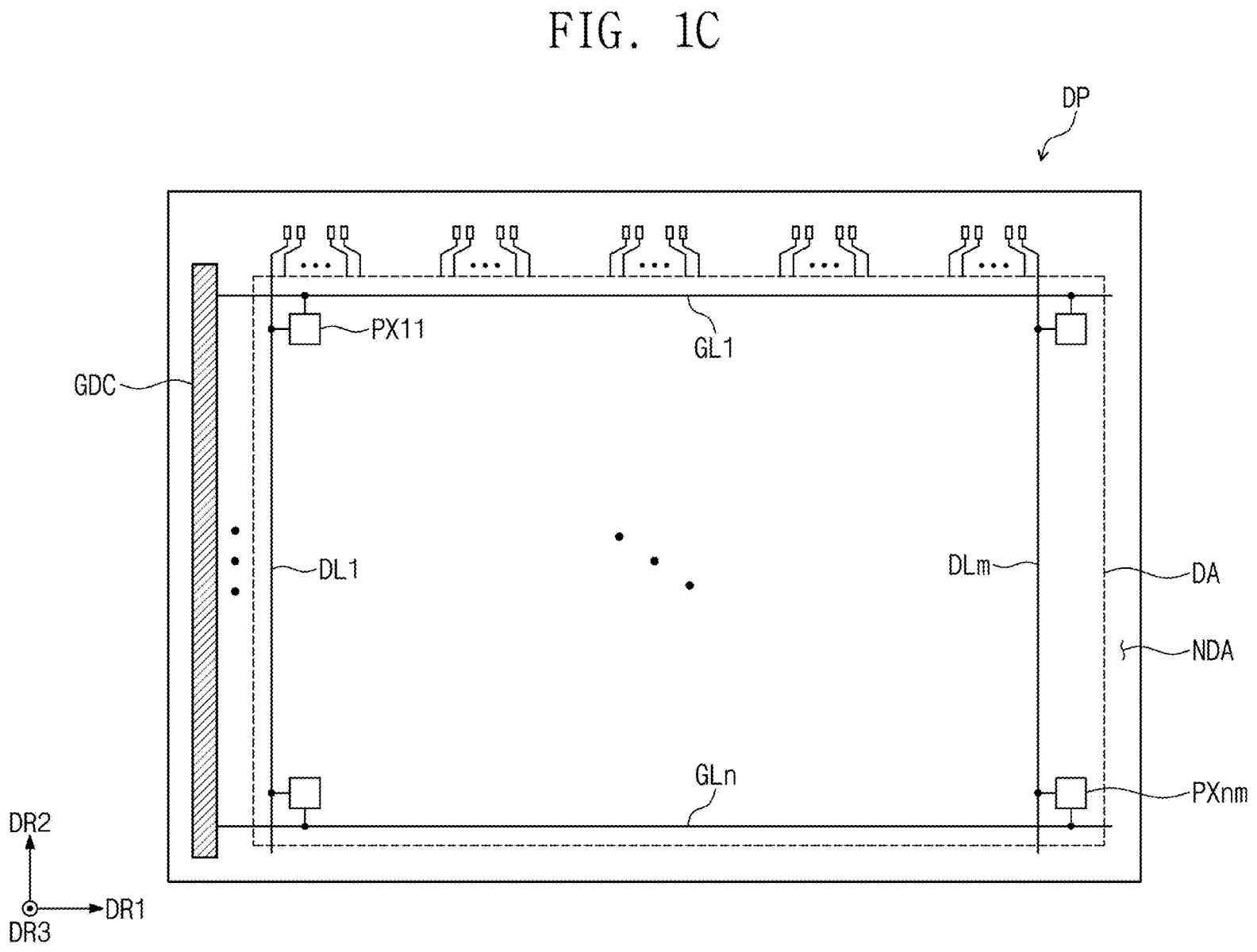

FIG. 1A is a perspective view of the display panel according to an embodiment of the present disclosure. FIG. 1B is a sectional view of the display panel according to an embodiment of the present disclosure. FIG. 1C is a plan view of the display panel according to an embodiment of the present disclosure.

As illustrated in FIG. 1A, the display panel DP may display an image through a display surface DP-IS. The display surface DP-IS is parallel to a plane defined by a first direction DR1 and a second direction DR2. The display surface DP-IS may include a display area DA and a non-display area NDA. Pixels PX are disposed in the display area DA and are not disposed in the non-display area NDA. The non-display area NDA is defined along the periphery of the display surface DP-IS. The non-display area NDA may surround the display area DA. However, without being limited thereto, the non-display area NDA may not be provided, or may be disposed only on one side of the display area DA, in an embodiment of the present disclosure.

The normal direction of the display surface DP-IS, that is, the thickness direction of the display panel DP is indicated by a third direction DR3. The front surfaces (or, the upper surfaces) and the rear surfaces (or, the lower surfaces) of layers or units to be described below are distinguished from each other based on the third direction DR3. However, the first to third directions DR1, DR2, and DR3 illustrated in this embodiment are merely illustrative.

Although the display panel DP including the planar display surface DP-IS is illustrated in an embodiment of the present disclosure, the present disclosure is not limited thereto. The display panel DP may include a curved display surface or a three-dimensional display surface. The three-dimensional display surface may include a plurality of display areas indicating different directions.

As illustrated in FIG. 1B, the display panel DP includes a base substrate BS, a circuit element layer DP-CL, a display element layer DP-LED, and an optical structure layer OSL. The base substrate BS may include a synthetic resin substrate or a glass substrate. The circuit element layer DP-CL includes at least one insulating layer and at least one circuit element. The circuit element includes a signal line, a pixel drive circuit, and/or the like. The circuit element layer DP-CL may be formed through a process of forming an insulating layer, a semiconductor layer, and a conductive layer by coating, deposition, and/or the like and a process of making the insulating layer, the semiconductor layer, and the conductive layer subject to patterning by a photolithography process. The display element layer DP-LED includes at least a display element. The optical structure layer OSL may convert the color of light provided from the display element. The optical structure layer OSL may include a light control pattern and a structure for increasing light conversion efficiency.

FIG. 1C illustrates an arrangement relationship between signal lines GL1 to GLn and DL1 to DLm and pixels PX11 to PXnm on the plane. The signal lines GL1 to GLn and DL1 to DLm may include the plurality of gate lines GL1 to GLn and the plurality of data lines DL1 to DLm.

Each of the pixels PX11 to PXnm is connected to a corresponding one of the plurality of gate lines GL1 to GLn and a corresponding one of the plurality of data lines DL1 to DLm. Each of the pixels PX11 to PXnm may include a pixel drive circuit and a display element. More types (kinds) of signal lines may be included in the display panel DP depending on the configurations of the pixel drive circuits of the pixels PX11 to PXnm.

Although the pixels PX11 to PXnm in a matrix form are illustrated, the present disclosure is not limited thereto. The pixels PX11 to PXnm may be disposed in a Pentile® form. In an example, the points at which the pixels PX11 to PXnm are disposed may correspond to vertexes of a Diamond™ form. A gate driver circuit GDC may be integrated into the display panel DP through an oxide silicon gate driver circuit (OSG) or amorphous silicon gate driver circuit (ASG) process.

Figure 2A:
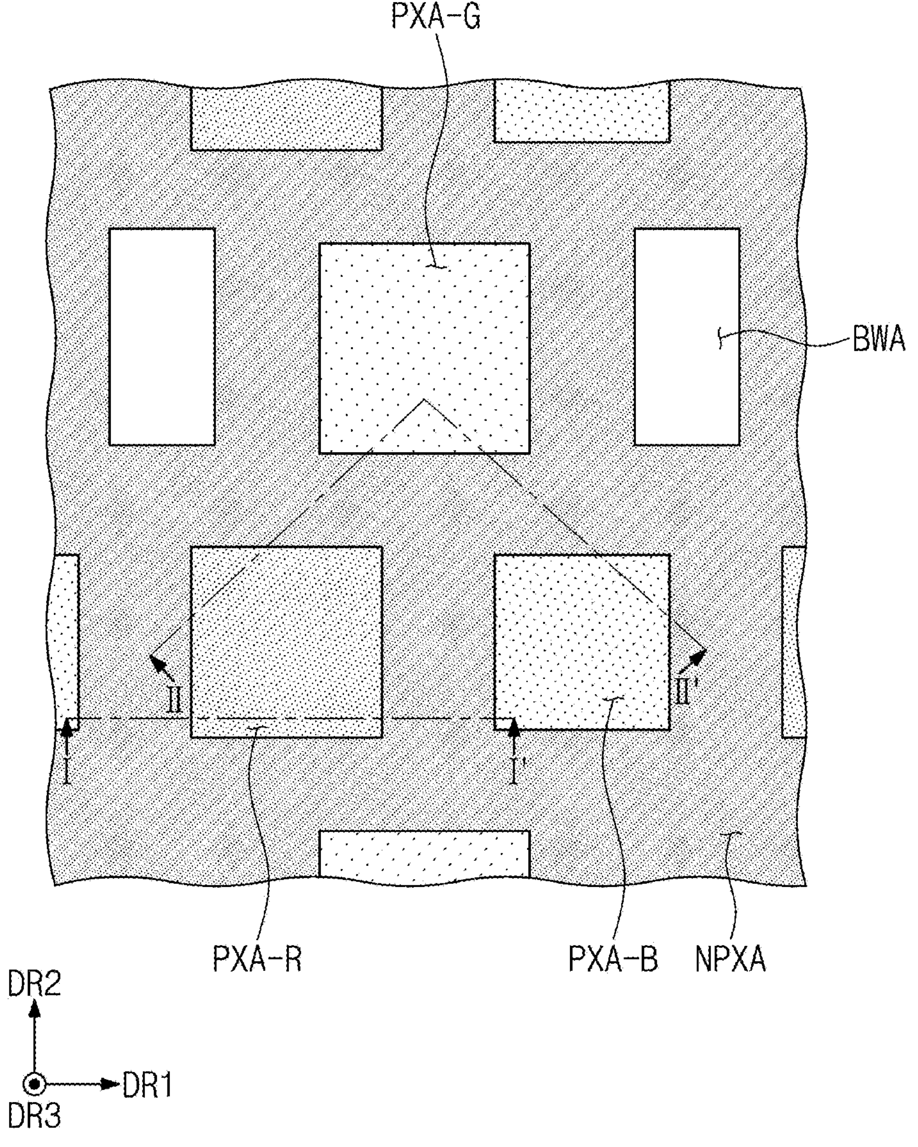
FIG. 2A is an enlarged plan view of a portion of the display panel according to an embodiment of the present disclosure.

FIG. 2A is an enlarged plan view of a portion of the display panel according to an embodiment of the present disclosure. FIG. 2A illustrates a flat surface including three pixel areas PXA-R, PXA-B, and PXA-G and bank well areas BWA adjacent thereto in the display panel DP (refer to FIG. 1A) according to an embodiment. In an embodiment of the present disclosure, the three types (kinds) of pixel areas PXA-R, PXA-B, and PXA-G illustrated in FIG. 2A may be repeatedly disposed in the entire display area DA (refer to FIG. 1A).

A peripheral area NPXA is disposed around the first to third pixel areas PXA-R, PXA-B, and PXA-G. The peripheral area NPXA sets the borders between the first to third pixel areas PXA-R, PXA-B, and PXA-G. The peripheral area NPXA may surround the first to third pixel areas PXA-R, PXA-B, and PXA-G. A structure for preventing or reducing color mixing between the first to third pixel areas PXA-R, PXA-B, and PXA-G, for example, a pixel defining film PDL (refer to FIG. 2B) or a bank BMP (refer to FIG. 2B) may be disposed in the peripheral area NPXA.

Although FIG. 2A illustrates the first to third pixel areas PXA-R, PXA-B, and PXA-G having the same planer shape and different areas, the present disclosure is not limited thereto. At least two of the first to third pixel areas PXA-R, PXA-B, and PXA-G may have the same area. The areas of the first to third pixel areas PXA-R, PXA-B, and PXA-G may be set depending on the colors of emitted light. A pixel area emitting light having a red color among primary colors may have the largest area, and a pixel area emitting blue light may have the smallest area.

Although FIG. 2A illustrates the first to third pixel areas PXA-R, PXA-B, and PXA-G having a rectangular shape, the present disclosure is not limited thereto. On the plane, the first to third pixel areas PXA-R, PXA-B, and PXA-G may have one or more suitable polygonal shapes (including a substantially polygonal shape) such as a rhombic shape or a pentagonal shape. In an embodiment, the first to third pixel areas PXA-R, PXA-B, and PXA-G may have, on the plane (e.g., in a plan view), a rounded rectangular shape (e.g., a substantially rectangular shape).

Although FIG. 2A illustrates an example that the third pixel area PXA-G is disposed in the first row and the first pixel area PXA-R and the second pixel area PXA-B are disposed in the second row, the present disclosure is not limited thereto, and the arrangement of the first to third pixel areas PXA-R, PXA-B, and PXA-G may be diversely changed. For example, the first to third pixel areas PXA-R, PXA-B, and PXA-G may be disposed in substantially the same row.

One of the first to third pixel areas PXA-R, PXA-B, and PXA-G provides second light corresponding to source light, another one provides first light different from the second light, and the other one provides third light different from the first light and the second light. In this embodiment, the second pixel area PXA-B provides the second light corresponding to the source light. In this embodiment, the first pixel area PXA-R may provide red light, the second pixel area PXA-B may provide blue light, and the third pixel area PXA-G may provide green light.

The bank well area BWA may be defined in the display area DA (refer to FIG. 1A). The bank well area BWA may be an area in which a bank well BW (refer to FIG. 5) is formed to prevent or reduce a defect due to erroneous adhesion in a process of forming a plurality of light control patterns CCP-R, CCP-B, and CCP-G (refer to FIG. 2C) included in a light control layer CCL (refer to FIG. 2C). For example, the bank well area BWA may be an area in which a bank well formed by removal of a portion of the bank BMP (refer to FIG. 2C) is defined.

Although FIG. 2A illustrates an example that two bank well areas BWA are defined adjacent to the third pixel area PXA-G, the present disclosure is not limited thereto, and the shape and arrangement of the bank wall areas BWA may be diversely changed.

Figure 2B:
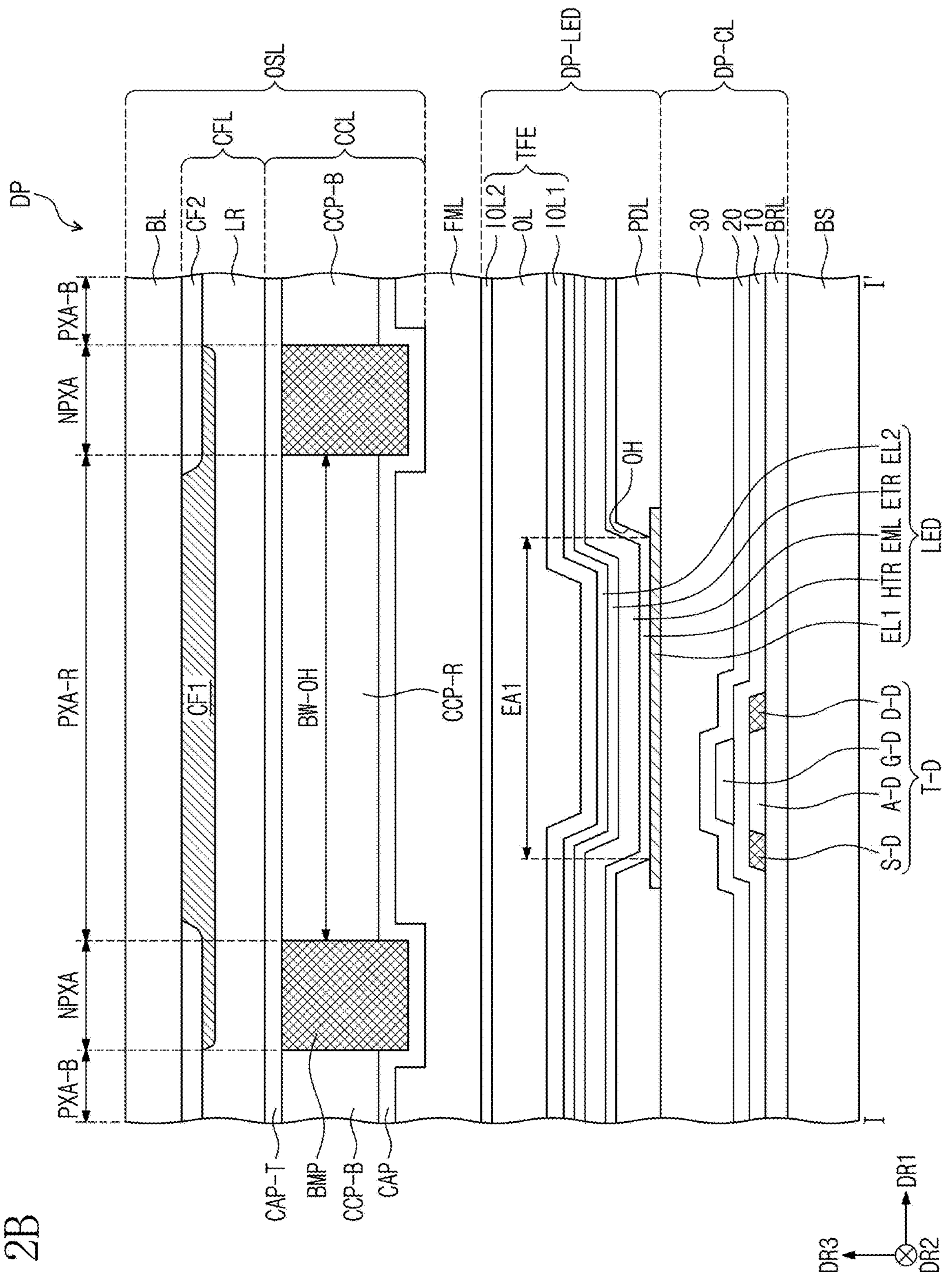
FIG. 2B is a sectional view of the display panel according to an embodiment of the present disclosure.
Figure 3:
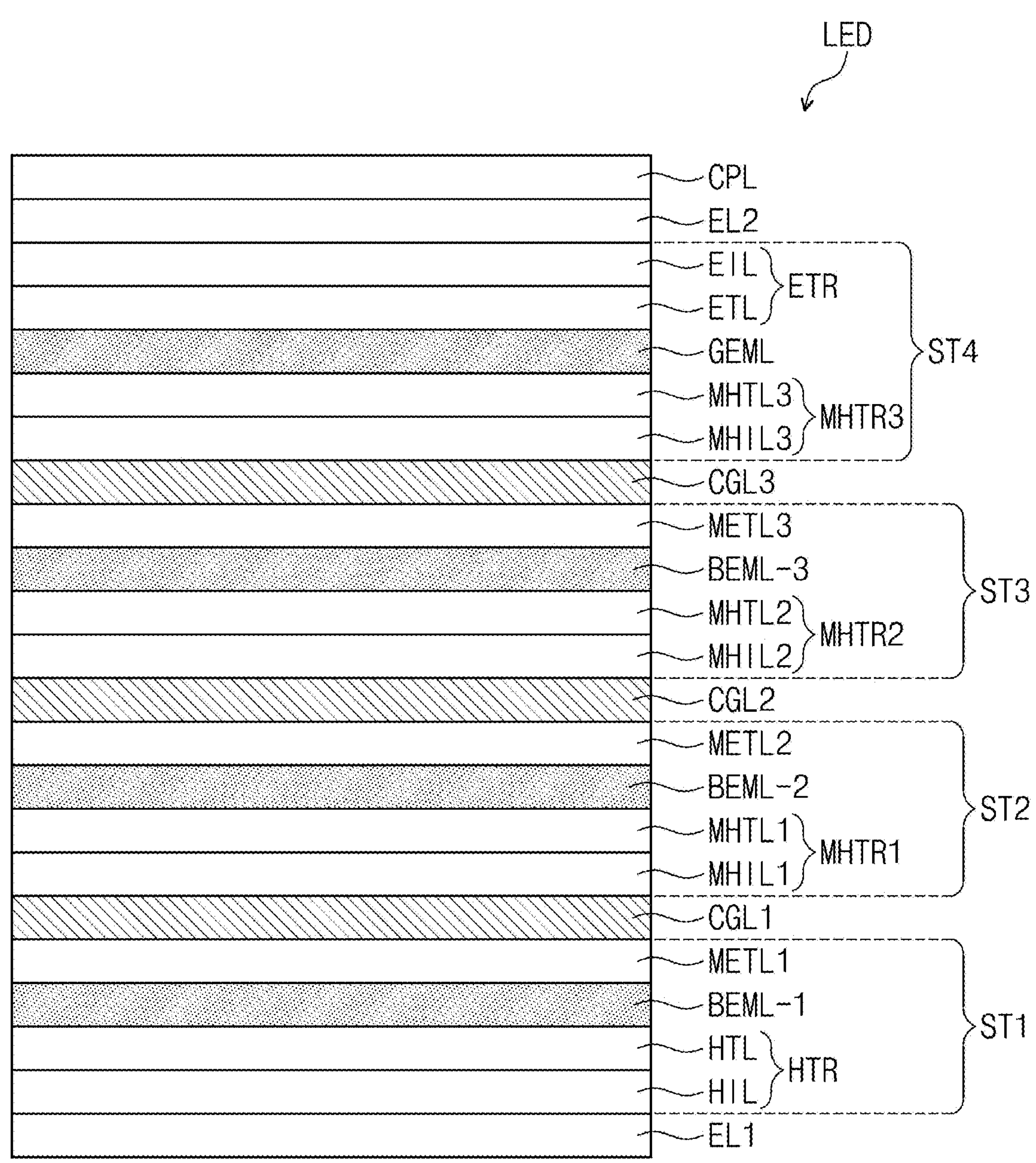
FIG. 3 is a sectional view of a light emitting element included in the display panel according to an embodiment of the present disclosure.

FIG. 2B is a sectional view of the display panel according to an embodiment of the present disclosure. FIG. 2C is an enlarged view of a partial area of a section of the display panel according to an embodiment of the present disclosure. FIG. 3 is a sectional view of a light emitting element included in the display panel according to an embodiment of the present disclosure. FIG. 2B is a sectional view taken along line I-I' of FIG. 2A. FIG. 2C is a sectional view taken along line II-II' of FIG. 2A.

Referring to FIG. 2B, the display panel DP of an embodiment may include the base substrate BS, the circuit element layer DP-CL disposed on the base substrate BS, and the display element layer DP-LED disposed on the circuit element layer DP-CL. In this specification, the base substrate BS, the circuit element layer DP-CL, and the display element layer DP-LED may be collectively referred to as the lower panel.

The base substrate BS may be a member that provides a base surface on which components included in the circuit element layer DP-CL are disposed. In an embodiment, the base substrate BS may be a glass substrate, a metal substrate, or a polymer substrate. However, without being limited thereto, the base substrate BS may be an inorganic layer, or a composite layer.

The base substrate BS may have a multi-layer structure. For example, the base substrate BS may have a three-layer structure including a polymer resin layer, an adhesive layer, and a polymer resin layer. In particular, the polymer resin layer may contain a polyimide-based resin. In some embodiments, the polymer resin layer may contain at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, or a perylene-based resin. In some embodiments, a "a"-based resin used herein refers to a resin containing a "a" functional group.

The circuit element layer DP-CL may be disposed on the base substrate BS. The circuit element layer DP-CL may include a transistor T-D as a circuit element. The configuration of the circuit element layer DP-CL may vary depending on the design of a drive circuit of the pixel PX (refer to FIG. 1A), and one transistor T-D is illustrated in FIG. 2B. The arrangement relationship of an active area A-D, a source S-D, a drain D-D, and a gate G-D that constitute the transistor T-D is illustrated. The active area A-D, the source S-D, and the drain D-D may be areas divided depending on the doping concentration or conductivity of a semiconductor pattern.

The circuit element layer DP-CL may include a lower buffer layer BRL, a first insulating layer 10, a second insulating layer 20, and a third insulating layer 30 disposed on the base substrate BS. For example, the lower buffer layer BRL, the first insulating layer 10, and the second insulating layer 20 may be inorganic layers, and the third insulating layer 30 may be an organic layer.

The display element layer DP-LED may include a light emitting element LED as a display element. The light emitting element LED may generate the above-described source light. The light emitting element LED includes a first electrode EL1, a second electrode EL2, and an emissive layer EML disposed therebetween. In this embodiment, the display element layer DP-LED may include an organic light emitting diode as a light emitting element. In an embodiment of the present disclosure, the light emitting element may include a quantum-dot light emitting diode. For example, the emissive layer EML included in the light emitting element LED may contain an organic light emitting material as a light emitting material, or may contain quantum dots as a light emitting material. In some embodiments, in this embodiment, the display element layer DP-LED may include a micro light emitting element, which will be described below, as a light emitting element. The micro light emitting element may include, for example, a micro LED element and/or a nano LED element. The micro light emitting element may be a light emitting element that has a micro-scale size or a nano-scale size and includes an active layer disposed between a plurality of semiconductor layers.

The first electrode EL1 is disposed on the third insulating layer 30. The first electrode EL1 may be directly or indirectly connected with the transistor T-D, and a connecting structure of the first electrode EL1 and the transistor T-D is not illustrated in FIG. 2B.

The display element layer DP-LED includes the pixel defining film PDL. For example, the pixel defining film PDL may be an organic layer. A light emission opening OH is defined in the pixel defining film PDL. The light emission opening OH of the pixel defining film PDL exposes at least a portion of the first electrode EL1. In this embodiment, a first emissive area EA1 may be defined by the light emission opening OH.

A hole control layer HTR, the emissive layer EML, and an electron control layer ETR overlap at least the pixel area PXA-R. The hole control layer HTR, the emissive layer EML, the electron control layer ETR, and the second electrode EL2 may be commonly disposed in the first to third pixel areas PXA-R, PXA-B, and PXA-G (refer to FIG. 2C). The hole control layer HTR, the emissive layer EML, the electron control layer ETR, and the second electrode EL2 that overlap the first to third pixel areas PXA-R, PXA-B, and PXA-G (refer to FIG. 2C) may each have an integral shape. However, without being limited thereto, at least one of the hole control layer HTR, the emissive layer EML, and the electron control layer ETR may be separately formed for each of the first to third pixel areas PXA-R, PXA-B, and PXA-G (refer to FIG. 2C). In an embodiment, the emissive layer EML may be patterned within the light emission opening OH and may be separately formed for each of the first to third pixel areas PXA-R, PXA-B, and PXA-G (refer to FIG. 2C).

The hole control layer HTR may include a hole transporting layer and may further include a hole injection layer.

The emissive layer EML may generate the third light that is source light. The emissive layer EML may generate blue light. The blue light may include light having a wavelength of 410 nm to 480 nm. The emission spectrum of the blue light may have a maximum peak in the wavelength range of 440 nm to 460 nm.

The electron control layer ETR may include an electron transporting layer and may further include an electron injection layer.

The display element layer DP-LED may include a thin film encapsulation layer TFE that protects the second electrode EL2. The thin film encapsulation layer TFE may contain an organic material or an inorganic material. The thin film encapsulation layer TFE may have a multi-layer structure in which inorganic layers and organic layers alternate with one another. In this embodiment, the thin film encapsulation layer TFE may include a first inorganic encapsulation layer IOL1, an organic encapsulation layer OL, and a second inorganic encapsulation layer IOL2. The first and second inorganic encapsulation layers IOL1 and IOL2 may protect the light emitting element LED from external moisture, and the organic encapsulation layer OL may prevent or reduce a dent defect of the light emitting element LED caused by foreign matter introduced during a manufacturing process. In some embodiments, the display panel DP may further include, on the thin film encapsulation layer TFE, a refractive index control layer for improving light emission efficiency.

As illustrated in FIG. 2B, the optical structure layer OSL is disposed on the thin film encapsulation layer TFE. The optical structure layer OSL may include the light control layer CCL, a color filter layer CFL, and a base layer BL. In this specification, the optical structure layer OSL may be referred to as the upper panel.

The light control layer CCL may be disposed over the display element layer DP-LED including the light emitting element LED. The light control layer CCL includes the bank BMP, the light control pattern CCP-R, and a barrier layer CAP.

The bank BMP may contain a base resin and an additive. The base resin may be composed of one or more suitable resin compositions that are generally referred to as binders.

The additive may include a coupling agent and/or a photoinitiator. The additive may further include a dispersing agent.

The bank BMP may contain a black coloring agent for light blocking. The bank BMP may contain a black dye or a black pigment mixed in the base resin. In an embodiment, the black coloring agent may include carbon black, metal such as chromium, or oxide thereof.

The bank BMP includes a bank opening BW-OH corresponding to the light emission opening OH. On the plane, the bank opening BW-OH overlaps the light emission opening OH and has a larger area than the light emission opening OH. For example, the bank opening BW-OH may have a larger area than the emissive area EA1 defined by the light emission opening OH. In some embodiments, the expression "corresponding to" used herein refers to two components overlapping each other when viewed in the thickness direction DR3 of the display panel DP and is not limited to the same area.

The light control pattern CCP-R is disposed in the bank opening BW-OH.

The light control pattern CCP-R may change optical properties of the source light.

The light control pattern CCP-R may contain quantum dots for changing optical properties of the source light. The light control pattern CCP-R may contain quantum dots that convert the source light into light having a different wavelength. In the light control pattern CCP-R overlapping the first pixel area PXA-R, the quantum dots may convert blue light, which is the source light, into red light.

The quantum dots may (e.g., may each) have a core-shell structure, and cores of the quantum dots may be selected from a Group II-VI compound, a Group III-VI compound, a Group I-III-VI compound, a Group III-V compound, a Group IV-VI compound, a Group IV element, a Group IV compound, and combinations thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and mixtures thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The Group III-VI compound may include a binary compound such as $In_2S_3$ or $In_2Se_3$, a ternary compound such as $InGaS_3$ or $InGaSe_3$, or a combination thereof.

The Group I-III-VI compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and mixtures thereof or a quaternary compound such as $AgInGaS_2$ or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the Group III-V compound may further include Group II metal. For example, InZnP may be selected as a Group III-II-V compound.

The Group IV-VI compound may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The Group IV element may be selected from the group consisting of Si, Ge, and a mixture thereof. The Group IV compound may be a binary compound selected from the group consisting of SiC, SiGe, and a mixture thereof.

In this case, the binary compound, the ternary compound, or the quaternary compound may exist in the particle in substantially uniform concentration, or may exist in substantially the same particle with a partially different concentration distribution. In some embodiments, the quantum dots may have a core-shell structure in which one quantum dot surrounds (e.g., encapsulates) another quantum dot. In the core-shell structure, the concentration of an element existing in the shell may have a concentration gradient in which the concentration is lowered toward the core.

In some embodiments, the quantum dots may have a core-shell structure that includes a core including a nanocrystal and a shell around (e.g., surrounding) the core. The shell of each quantum dot may serve as a protective layer for maintaining semiconductor characteristics by preventing or reducing chemical modification of the core and/or a charging layer for imparting electrophoretic characteristics to the quantum dot. The shell may have a single layer or multiple layers. The shell of the quantum dot may be, for example, metal oxide, non-metal oxide, a semiconductor compound, or a combination thereof.

For example, the metal oxide and the non-metal oxide may include a binary compound such as $SiO_2$, $AL_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound such as $MgAl_2O_4$, $CoFe_2O_4$, $NiFe_2O_4$, or $CoMn_2O_4$, but the present disclosure is not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, but the present disclosure is not limited thereto.

The quantum dots may have a full width at half maximum (FWHM) of a light emission wavelength spectrum that is about 45 nm or less, about 40 nm or less, or about 30 nm or less and may improve color purity or color reproduction in the range. Furthermore, light emitted through the quantum dots may be emitted in all directions, and thus a wide viewing angle may be improved.

The forms of the quantum dots are not particularly limited to forms generally used in the related art. More specifically, a nanoparticle, a nanotube, a nanowire, a nanofiber, or a nanoplatelet particle that has a spherical, pyramidal, multi-arm, or cubic shape may be used.

The quantum dots may adjust the color of emitted light depending on the particle sizes. Accordingly, the quantum dots may have one or more suitable light emission colors such as blue, red, and green. In an embodiment, the quantum dots contained in the light control pattern CCP-R overlapping the first pixel area PXA-R may have red emission color. The smaller the particle sizes of quantum dots, the shorter the wavelengths of emitted light. For example, the particle sizes of quantum dots having the same core and emitting green light may be smaller than the particle sizes of quantum dots having the same core and emitting red light. Furthermore, the particle sizes of quantum dots having the same core and emitting blue light may be smaller than the particle sizes of quantum dots having the same core and emitting green light. However, without being limited thereto, the particle sizes of quantum dots having the same core may be adjusted depending on the materials and thicknesses of shells.

In some embodiments, when quantum dots have one or more suitable light emission colors such as blue, red, and green, the materials of cores of the quantum dots having the different light emission colors may differ from one another.

The light control pattern CCP-R may further contain scattering bodies. The light control pattern CCP-R may contain quantum dots that convert blue light into red light and scattering bodies that scatter light.

The scattering bodies may be inorganic particles. For example, the scattering bodies may include at least one of $TiO_2$, ZnO, $Al_2O_3$, $SiO_2$, and hollow silica. The scattering bodies may include one of $TiO_2$, ZnO, $Al_2O_3$, $SiO_2$, and hollow silica, or may be a mixture of two or more types (e.g, kinds) of materials selected from $TiO_2$, ZnO, $Al_2O_3$, $SiO_2$, and hollow silica.

The light control pattern CCP-R may contain a base resin that disperses the quantum dots and the scattering bodies. The base resin may be a medium in which the quantum dots and the scattering bodies are dispersed and may be composed of one or more suitable resin compositions that are generally referred to as binders. For example, the base resin may be an acryl-based resin, a urethane-based resin, a silicone-based resin, or an epoxy-based resin. The base resin may be a transparent resin.

In this embodiment, the light control pattern CCP-R may be formed by an inkjet process. A liquid composition is provided within the bank opening BW-OH. The volume of the composition polymerized by a thermal-curing process or a photo-curing process is reduced after curing.

A step may be formed between the upper surface of the bank BMP and the upper surface of the light control pattern CCP-R. For example, the upper surface of the bank BMP may be defined in a higher position than the upper surface of the light control pattern CCP-R. The height difference between the upper surface of the bank BMP and the upper surface of the light control pattern CCP-R may be, for example, about 2 μm to about 3 μm.

The light control layer CCL includes the barrier layer CAP on one surface of the light control pattern CCP-R. The barrier layer CAP may serve to prevent or reduce infiltration of moisture and/or oxygen (hereinafter, referred to as the "moisture/oxygen"). The barrier layer CAP may be disposed on the upper or lower surface of the light control pattern CCP-R and may block or reduce exposure of the light control pattern CCP-R to the moisture/oxygen. In particular, the barrier layer CAP may block or reduce exposure of the quantum dots contained in the light control pattern CCP-R to the moisture/oxygen. Furthermore, the barrier layer CAP may protect the light control pattern CCP-R from an external impact.

In an embodiment, the barrier layer CAP may be disposed adjacent to the display element layer DP-LED. For example, the barrier layer CAP may be disposed on the lower surface of the light control pattern CCP-R. In an embodiment, the light control layer CCL may include an additional barrier layer CAP-T spaced apart from the display element layer DP-LED with the light control pattern CCP-R therebetween. The barrier layer CAP may cover the lower surface of the light control pattern CCP-R that is adjacent to the display element layer DP-LED, and the additional barrier layer CAP-T may cover the upper surface of the light control pattern CCP-R that is adjacent to the color filter layer CFL. In some embodiments, an "upper surface" may be a surface located on the top based on the third direction DR3, and a "lower surface" may be a surface located on the bottom based on the third direction DR3.

Furthermore, the barrier layer CAP and the additional barrier layer CAP-T may cover not only the light control pattern CCP-R but also the bank BMP.

The barrier layer CAP may be disposed while following a step between the bank BMP and the light control pattern CCP-R. The additional barrier layer CAP-T may cover one surface of the bank BMP and one surface of the light control pattern CCP-R that are adjacent to the color filter layer CFL. The additional barrier layer CAP-T may be directly disposed on the bottom of a low refractive index layer LR.

The barrier layer CAP and the additional barrier layer CAP-T may contain an inorganic material. In the display panel DP of an embodiment, the barrier layer CAP contains silicon oxy-nitride SiON. Both the barrier layer CAP and the additional barrier layer CAP-T may contain silicon oxy-nitride. However, without being limited thereto, the barrier layer CAP disposed on the bottom of the light control pattern CCP-R may contain silicon oxy-nitride, and the additional barrier layer CAP-T disposed on the top of the light control pattern CCP-R may contain silicon oxide SiOx. However, the present disclosure is not limited thereto.

In some embodiments, the barrier layer CAP and the additional barrier layer CAP-T may further include an organic film. The barrier layers CAP and CAP-T may include a single layer or a plurality of layers. In the barrier layers CAP and CAP-T, the inorganic films may protect the light control pattern CCP-R from external moisture, and the organic films may remove (e.g., planarize) steps defined by the bank BMP and the light control pattern CCP-R and may provide a flat base surface to a member to be disposed thereon.

To prevent or reduce infiltration of moisture/oxygen into the light control pattern CCP-R, raise film durability, and have a refractive index range that does not deteriorate the light efficiency of the display panel, the composition ratio of silicon, oxygen, and nitrogen in the silicon oxy-nitride film is limited to a set or predetermined range. The composition ratio of the barrier layer CAP of an embodiment will be described below in more detail with reference to FIG. 4A.

The color filter layer CFL is disposed on the light control layer CCL. The color filter layer CFL includes at least one color filter CF1. The color filter CF1 transmits light in a specific wavelength range and blocks light outside the corresponding wavelength range. The color filter CF1 of the first pixel area PXA-R may transmit red light and may block or reduce green light and blue light.

The color filter CF1 contains a base resin and a dye and/or a pigment dispersed in the base resin. The base resin may be a medium in which the dye and/or the pigment is dispersed and may be composed of one or more suitable resin compositions that are generally referred to as binders.

The color filter CF1 may have a substantially uniform thickness in the first pixel area PXA-R. Light converted from the source light, which is blue light, to red light through the light control pattern CCP-R may be provided to the outside with substantially uniform luminance from the inside of the first pixel area PXA-R.

The color filter layer CFL may include the low refractive index layer LR. The low refractive index layer LR may be disposed between the light control layer CCL and the color filter CF1. The low refractive index layer LR may be disposed on the top of the light control layer CCL and may block or reduce exposure of the light control pattern CCP-R to moisture/oxygen. Furthermore, the low refractive index layer LR may be disposed between the light control pattern CCP-R and the color filter CF1 and may function as an optical functional layer that raises light extraction efficiency or prevents (reduces) incidence of reflected light on the light control layer CCL. The low refractive index layer LR may have a lower refractive index than a layer adjacent thereto.

The low refractive index layer LR may include at least one inorganic layer. For example, the low refractive index layer LR may contain silicon nitride, aluminum nitride, zirconium nitride, titanium nitride, hafnium nitride, tantalum nitride, silicon oxide, aluminum oxide, titanium oxide, tin oxide, cerium oxide, or silicon oxy-nitride, or may include a metal thin film with secured light transmittance. However, without being limited thereto, the low refractive index layer LR may include an organic film. For example, the low refractive index layer LR may contain a polymer resin and inorganic particles. The low refractive index layer LR may include a single layer or a plurality of layers.

In some embodiments, the color filter CF1 of the color filter layer CFL may be directly disposed on the light control layer CCL. In this case, the low refractive index layer LR may not be provided or needed.

In an embodiment, the display panel DP may further include the base layer BL disposed on the color filter layer CFL. The base layer BL may be a member that provides a base surface on which the color filter layer CFL and the light control layer CCL are disposed. The base layer BL may be a glass substrate, a metal substrate, or a plastic substrate. However, without being limited thereto, the base layer BL may be an inorganic layer, an organic layer, or a composite layer. Furthermore, unlike in FIG. 2B, the base layer BL may not be provided in an embodiment.

In some embodiments, an anti-reflection layer may be disposed on the base layer BL. The anti-reflection layer may be a layer that decreases the reflectivity of external light incident from the outside. The anti-reflection layer may be a layer that selectively transmits light emitted from the display panel DP. In an embodiment, the anti-reflection layer may be a single layer that contains a dye and/or a pigment dispersed in a base resin. The anti-reflection layer may be implemented with one substantially continuous layer that completely overlaps all of the first to third pixel areas PXA-R, PXA-B, and PXA-G (refer to FIG. 2C).

The anti-reflection layer may not include (e.g., may exclude) a polarization layer. Accordingly, light directed toward the display element layer DP-LED through the anti-reflection layer may be unpolarized light. The display element layer DP-LED may receive unpolarized light from above the anti-reflection layer.

The display panel DP of an embodiment may include the lower panel including the display element layer DP-LED and the upper panel (the optical structure layer OSL) including the light control layer CCL and the color filter layer CFL. In an embodiment, a filling layer FML may be disposed between the lower panel and the upper panel OSL. In an embodiment, the filling layer FML may fill the space between the display element layer DP-LED and the light control layer CCL. The filling layer FML may be directly disposed on the encapsulation layer TFE, and the barrier layer CAP included in the light control layer CCL may be directly disposed on the filling layer FML. The lower surface of the filling layer FML may make contact with the upper surface of the encapsulation layer TFE, and the upper surface of the filling layer FML may make contact with the lower surface of the barrier layer CAP.

The filling layer FML may function as a buffer between the display element layer DP-LED and the light control layer CCL. In an embodiment, the filling layer FML may perform a shock absorbing function and may increase the strength of the display panel DP. The filling layer FML may be formed from a filling resin including a polymer resin. For example, the filling layer FML may be formed from a filling layer resin including an acryl-based resin or an epoxy-based resin.

The filling layer FML may be a component distinguished from the encapsulation layer TFE disposed below and the barrier layer CAP disposed above and may be formed in a separate process step. In some embodiments, the filling layer FML may be formed of a material different from the materials of the encapsulation layer TFE and the barrier layer CAP.

Referring to FIG. 2C, the display panel DP may include the base substrate BS and the circuit element layer DP-CL disposed on the base substrate BS. The circuit element layer DP-CL may be disposed on the base substrate BS. The circuit element layer DP-CL may include an insulating layer, a semiconductor pattern, a conductive pattern, and a signal line. An insulating layer, a semiconductor layer, and a conductive layer may be formed on the base substrate BS by a method such as coating or deposition and may be selectively subjected to patterning by performing a photolithography process a plurality of times. Thereafter, the semiconductor pattern, the conductive pattern, and the signal line included in the circuit element layer DP-CL may be formed. In an embodiment, the circuit element layer DP-CL may include a transistor, a buffer layer, and a plurality of insulating layers.

The light emitting element LED according to an embodiment may include the first electrode EL1, the second electrode EL2 facing the first electrode EL1, and the emissive layer EML disposed between the first electrode EL1 and the second electrode EL2. The emissive layer EML included in the light emitting element LED may contain an organic light emitting material as a light emitting material, or may contain quantum dots as a light emitting material. The light emitting element LED may further include the hole control layer HTR and the electron control layer ETR. In some embodiments, the light emitting element LED may further include a capping layer that is disposed on the second electrode EL2.

The pixel defining film PDL may be disposed on the circuit element layer DP-CL and may cover a portion of the first electrode EL1. The light emission opening OH is defined in the pixel defining film PDL. The light emission opening OH of the pixel defining film PDL exposes at least a portion of the first electrode EL1. In this embodiment, the emissive areas EA1, EA2, and EA3 are defined to correspond to partial areas of the first electrodes EL1 exposed through the light emission openings OH.

The display element layer DP-LED may include the first emissive area EA1, the second emissive area EA2, and the third emissive area EA3. The first emissive area EA1, the second emissive area EA2, and the third emissive area EA3 may be areas divided by the pixel defining film PDL. The first emissive area EA1, the second emissive area EA2, and the third emissive area EA3 may correspond to the first pixel area PXA-R, the second pixel area PXA-B, and the third pixel area PXA-G, respectively.

The emissive areas EA1, EA2, and EA3 may overlap the pixel areas PXA-R, PXA-B, and PXA-G and may not overlap the bank well area BWA. When viewed on the plane (e.g., in a plan view), the areas of the pixel areas PXA-R, PXA-B, and PXA-G divided by the bank BMP may be larger than the areas of the emissive areas EA1, EA2, and EA3 divided (e.g., defined) by the pixel defining film PDL.

In the light emitting element LED, the first electrode EL1 is disposed on the circuit element layer DP-CL. The first electrode EL1 may be an anode or a cathode. Furthermore, the first electrode EL1 may be a pixel electrode. The first electrode EL1 may be a transparent electrode, a translucent electrode, or a reflective electrode.

The hole control layer HTR may be disposed between the first electrode EL1 and the emissive layer EML. The hole control layer HTR may include at least one of a hole injection layer, a hole transporting layer, or an electron blocking layer. The hole control layer HTR may be disposed as a common layer to overlap the emissive areas EA1, EA2, and EA3 and the entire pixel defining film PDL dividing the emissive areas EA1, EA2, and EA3. However, without being limited thereto, the hole control layer HTR may be subjected to patterning so as to be separated to correspond to the emissive areas EA1, EA2, and EA3.

The emissive layer EML is disposed on the hole control layer HTR. In an embodiment, the emissive layer EML may be provided as a common layer to overlap the emissive areas EA1, EA2, and EA3 and the entire pixel defining film PDL dividing the emissive areas EA1, EA2, and EA3. In an embodiment, the emissive layer EML may emit blue light. The emissive layer EML may overlap the entire hole control layer HTR and the entire electron control layer ETR.

However, without being limited thereto, the emissive layer EML may be disposed in the light emission openings OH in an embodiment. For example, the emissive layer EML may be separated to correspond to the emissive areas EA1, EA2, and EA3 divided by the pixel defining film PDL. The emissive layers EML separately formed to correspond to the emissive areas EA1, EA2, and EA3 may all emit blue light, or may emit light in different wavelength areas.

The emissive layer EML may have a multi-layer structure that has a single layer made of a single material, a single layer made of a plurality of different materials, or a plurality of layers made of a plurality of different materials. The emissive layer EML may contain a fluorescent material or a phosphorescent material. The emissive layer EML in the light emitting element of an embodiment may contain an organic light emitting material, a metal organic complex, or quantum dots as a light emitting material. In some embodiments, the light emitting element LED including one emissive layer EML is illustrated in FIGS. 2B and 2C, but in an embodiment, the light emitting element LED may include a plurality of light emitting stacks, each of which includes at least one emissive layer.

FIG. 3 illustrates a light emitting element LED including a plurality of light emitting stacks ST1, ST2, ST3, and ST4 unlike the light emitting element of the embodiment illustrated in FIGS. 2B and 2C.

Referring to FIG. 3, the light emitting element LED of an embodiment may include a first electrode EL1, a second electrode EL2 facing the first electrode EL1, and the first to fourth light emitting stacks ST1, ST2, ST3, and ST4 disposed between the first electrode EL1 and the second electrode EL2. Although FIG. 3 illustrates an example that the light emitting element LED includes four light emitting stacks, the light emitting element LED may include more or fewer light emitting stacks.

The light emitting element LED may include first to third charge generation layers CGL1, CGL2, and CGL3 disposed between the first to fourth light emitting stacks ST1, ST2, ST3, and ST4.

The first to third charge generation layers CGL1, CGL2, and CGL3 may generate charges (electrons and holes) by forming complexes through an oxidation/reduction reaction when a voltage is applied thereto. Thereafter, the first to third charge generation layers CGL1, CGL2, and CGL3 may provide the generated charges to the stacks ST1, ST2, ST3, and ST4 adjacent thereto. The first to third charge generation layers CGL1, CGL2, and CGL3 may double the efficiency of currents generated from the adjacent stacks ST1, ST2, ST3, and ST4 and may serve to adjust the balance of the charges between the adjacent stacks ST1, ST2, ST3, and ST4.

Each of the first to third charge generation layers CGL1, CGL2, and CGL3 may include an n-type layer and a p-type layer. The first to third charge generation layers CGL1, CGL2, and CGL3 may have a structure in which the n-type layer (e.g., N-charge layer) and the p-type layer (e.g., P-charge layer) are bonded to each other. However, without being limited thereto, the first to third charge generation layers CGL1, CGL2, and CGL3 may include only one selected from among the n-type layer and the p-type layer. The n-type layer may be a charge generation layer that provides electrons to an adjacent stack. The n-type layer may be a layer in which a base material is doped with an n-dopant. The p-type layer may be a charge generation layer that provides holes to an adjacent stack.

In an embodiment, the first to third charge generation layers CGL1, CGL2, and CGL3 may have a thickness of about 1 angstrom (Å) to about 150 angstrom (Å). The concentration of the n-dopant doped in the first to third charge generation layers CGL1, CGL2, and CGL3 may range from about 0.1% to about 3% and specifically may be about 1% or less. When the concentration is less than about 0.1%, effects of the first to third charge generation layers CGL1, CGL2, and CGL3 that adjust the balance of charges may not occur almost at all. When the concentration is more than about 3%, the light efficiency of the light emitting element LED may be lowered.

The first to third charge generation layers CGL1, CGL2, and CGL3 may contain a charge generation compound consisting of an aryl amine-based organic compound, metal, metal oxide, carbide, fluoride, or a mixture thereof. For example, the aryl amine-based organic compound may include α-NPD, 2-TNATA, TDATA, MTDATA, sprio-TAD, or sprio-NPB. The metal may include cesium (Cs), molybdenum (Mo), vanadium (V), titanium (Ti), tungsten (W), barium (Ba), or lithium (Li). The metal oxide, the carbide, and the fluoride may include $Re_2O_7$, $MoO_3$, $V_2O_5$, $WO_3$, $TiO_2$, $Cs_2CO_3$, BaF, LiF, or CsF. However, the materials of the first to third charge generation layers CGL1, CGL2, and CGL3 are not limited thereto.

The first to fourth light emitting stacks ST1, ST2, ST3, and ST4 may include emissive layers, respectively. The first light emitting stack ST1 may include a first emissive layer BEML-1. The second light emitting stack ST2 may include a second emissive layer BEML-2. The third light emitting stack ST3 may include a third emissive layer BEML-3. The fourth light emitting stack ST4 may include a fourth emissive layer GEML. Some of the emissive layers included in the first to fourth light emitting stacks ST1, ST2, ST3, and ST4 may emit substantially the same color light, and the other emissive layers may emit different color light.

In an embodiment, the first to third emissive layers BEML-1, BEML-2, and BEML-3 of the first to third light emitting stacks ST1, ST2, and ST3 may emit substantially the same first color light. For example, the first color light may be blue light that is the above-described source light. The light emitted by the first to third emissive layers BEML-1, BEML-2, and BEML-3 may have a wavelength range of about 420 nm to about 480 nm.

The fourth emissive layer GEML of the fourth light emitting stack ST4 may emit second color light different from the first color light. For example, the second color light may be green light. The light emitted by the fourth emissive layer GEML may have a wavelength range of about 520 nm to about 600 nm.

At least some of the first to fourth emissive layers BEML-1, BEML-2, BEML-3, and GEML may have a bi-layer structure including different host materials. For example, one layer of the bi-layer structure may contain a hole transporting host material, and the other layer may contain an electron transporting host material. The electron transporting host material may be a material containing an electron transporting moiety in a molecular structure.

The first light emitting stack ST1 may include a hole control layer HTR that transports holes provided from the first electrode EL1 to the first emissive layer BEML-1 and a first intermediate electron control layer METL1 that transports electrons generated from the first charge generation layer CGL1 to the first emissive layer BEML-1.

The hole control layer HTR may include a hole injection layer HIL disposed on the first electrode EL1 and a hole transporting layer HTL disposed on the hole injection layer HIL. However, without being limited thereto, the hole control layer HTR may further include at least one of a hole buffer layer, a light-emission assisting layer, oran electron blocking layer. The hole buffer layer may be a layer that increases light emission efficiency by compensating for the resonance distance depending on the wavelength of light emitted from the emissive layer. The electron blocking layer may be a layer that serves to prevent or reduce electron injection from the electron transporting layer to the hole transporting layer.

The first intermediate electron control layer METL1 may include a first intermediate electron transporting layer disposed on the first emissive layer BEML-1. However, without being limited thereto, the first intermediate electron control layer METL1 may further include at least one of an electron buffer layer and a hole blocking layer.

The second light emitting stack ST2 may include a first intermediate hole control layer MHTR1 that transports holes generated from the first charge generation layer CGL1 to the second emissive layer BEML-2 and a second intermediate electron control layer METL2 that transports electrons provided from the second charge generation layer CGL2 to the second emissive layer BEML-2.

The first intermediate hole control layer MHTR1 may include a first intermediate hole injection layer MHIL1 disposed on the first charge generation layer CGL1 and a first intermediate hole transporting layer MHTL1 disposed on the first intermediate hole injection layer MHIL1. The first intermediate hole control layer MHTR1 may further include at least one of a hole buffer layer, a light-emission assisting layer, or an electron blocking layer that are (is) disposed on the first intermediate hole transporting layer MHTL1.

The second intermediate electron control layer METL2 may include a second intermediate electron transporting layer disposed on the second emissive layer BEML-2. However, without being limited thereto, the second intermediate electron control layer METL2 may further include at least one of an electron buffer layer or a hole blocking layer that are (is) disposed between the second intermediate electron transporting layer and the second emissive layer BEML-2.

The third light emitting stack ST3 may include a second intermediate hole control layer MHTR2 that transports holes generated from the second charge generation layer CGL2 to the third emissive layer BEML-3 and a third intermediate electron control layer METL3 that transports electrons provided from the third charge generation layer CGL3 to the third emissive layer BEML-3.

The second intermediate hole control layer MHTR2 may include a second intermediate hole injection layer MHIL2 disposed on the second charge generation layer CGL2 and a second intermediate hole transporting layer MHTL2 disposed on the second intermediate hole injection layer MHIL2. However, without being limited thereto, the second intermediate hole control layer MHTR2 may further include at least one of a hole buffer layer, a light-emission assisting layer, or an electron blocking layer that are (is) disposed on the second intermediate hole transporting layer MHTL2.

The third intermediate electron control layer METL3 may include a third intermediate electron transporting layer disposed on the third emissive layer BEML-3. However, without being limited thereto, the third intermediate electron control layer METL3 may further include at least one of an electron buffer layer or a hole blocking layer that are (is) disposed between the third intermediate electron transporting layer and the third emissive layer BEML-3.

The fourth light emitting stack ST4 may include a third intermediate hole control layer MHTR3 that transports holes generated from the third charge generation layer CGL3 to the fourth emissive layer GEML and an electron control layer ETR that transports electrons provided from the second electrode EL2 to the fourth emissive layer GEML.

The third intermediate hole control layer MHTR3 may include a third intermediate hole injection layer MHIL3 disposed on the third charge generation layer CGL3 and a third intermediate hole transporting layer MHTL3 disposed on the third intermediate hole injection layer MHIL3. However, without being limited thereto, the third intermediate hole control layer MHTR3 may further include at least one of a hole buffer layer, a light-emission assisting layer, or an electron blocking layer that are (is) disposed on the third intermediate hole transporting layer MHTL3.

The electron control layer ETR may include an electron transporting layer ETL disposed on the fourth emissive layer GEML and an electron injection layer EIL disposed on the electron transporting layer ETL. However, without being limited thereto, the electron control layer ETR may further include at least one of an electron buffer layer or a hole blocking layer that are (is) disposed between the electron transporting layer ETL and the fourth emissive layer GEML.

In an embodiment, the light emitting element LED may emit light in the direction from the first electrode EL1 to the second electrode EL2, and based on the direction in which the light is emitted, the hole control layer HTR may be disposed under the plurality of light emitting stacks ST1, ST2, ST3, and ST4, and the electron control layer ETR may be disposed over the plurality of light emitting stacks ST1, ST2, ST3, and ST4. However, without being limited thereto, the light emitting element LED may have an inverted element structure in which, based on the light emission direction, the electron control layer ETR is disposed under the plurality of light emitting stacks ST1, ST2, ST3, and ST4 and the hole control layer HTR is disposed over the plurality of light emitting stacks ST1, ST2, ST3, and ST4.

Referring again to FIG. 2C, the electron control layer ETR may be disposed between the emissive layer EML and the second electrode EL2. The electron control layer ETR may include at least one of an electron injection layer, an electron transporting layer, and a hole blocking layer. Referring to FIG. 2C, the electron control layer ETR may be disposed as a common layer to overlap the emissive areas EA1, EA2, and EA3 and the entire pixel defining film PDL dividing the emissive areas EA1, EA2, and EA3. However, without being limited thereto, the electron control layer ETR may be subjected to patterning so as to be separated to correspond to the emissive areas EA1, EA2, and EA3.

The second electrode EL2 is provided on the electron control layer ETR. The second electrode EL2 may be a common electrode. The second electrode EL2 may be a cathode or an anode, but the present disclosure is not limited thereto. For example, when the first electrode EL1 is an anode, the second electrode EL2 may be a cathode, and when the first electrode EL1 is a cathode, the second electrode EL2 may be an anode. The second electrode EL2 may be a transparent electrode, a translucent electrode, or a reflective electrode.

The encapsulation layer TFE may be disposed on the light emitting element LED. For example, in an embodiment, the encapsulation layer TFE may be disposed on the second electrode EL2. Furthermore, when the light emitting element LED includes a capping layer, the encapsulation layer TFE may be disposed on the capping layer. As described above, the encapsulation layer TFE may include one or more organic films and one or more inorganic films, and the inorganic films and the organic films may be disposed to alternate with one another.

The display panel DP of an embodiment may include the optical structure layer OSL disposed on the display element layer DP-LED. The optical structure layer OSL may include the light control layer CCL, the color filter layer CFL, and the base layer BL.

The light control layer CCL may include a light converter. The light converter may be quantum dots or a fluorescent substance. The light converter may convert the wavelength of light provided and may emit the light. For example, the light control layer CCL may be a layer that contains quantum dots in at least a portion thereof, or may be a layer that contains a fluorescent substance in at least a portion thereof.

The light control layer CCL may include the plurality of light control patterns CCP-R, CCP-B, and CCP-G. The light control patterns CCP-R, CCP-B, and CCP-G may be spaced apart from each other. The light control patterns CCP-R, CCP-B, and CCP-G may be spaced apart from each other by the bank BMP. The light control patterns CCP-R, CCP-B, and CCP-G may be disposed in the bank openings BW-OH defined in the bank BMP. However, the present disclosure is not limited thereto. In FIG. 2C, the bank BMP is illustrated as having a rectangular shape on the section and not overlapping the light control patterns CCP-R, CCP-B, and CCP-G. However, the edges of the light control patterns CCP-R, CCP-B, and CCP-G may at least partially overlap the bank BMP. The bank BMP may have a trapezoidal shape on the section. The bank BMP may have a shape in which the width on the section is increased toward the display element layer DP-LED.

The light control patterns CCP-R, CCP-B, and CCP-G may be portions that convert the wavelength of light provided from the display element layer DP-LED or transmit the light provided. The light control patterns CCP-R, CCP-B, and CCP-G may be formed by an inkjet process. A liquid ink composition may be provided in the bank openings BW-OH, and the ink composition may be polymerized by a thermal-curing process or a photo-curing process to form the light control patterns CCP-R, CCP-B, and CCP-G.

The light control layer CCL may include the first light control pattern CCP-R including first quantum dots that convert the source light provided from the light emitting element LED into the first light, the second light control pattern CCP-B that transmits the source light, and the third light control pattern CCP-G including second quantum dots that convert the source light into the second light.

In an embodiment, the first light control pattern CCP-R may provide red light that is the first light, and the second light control pattern CCP-B may transmit and provide blue light that is the source light provided from the light emitting element LED. The third light control pattern CCP-G may provide green light that is the second light. For example, the first quantum dots may be red quantum dots, and the second quantum dots may be green quantum dots.

The light control layer CCL may further contain scattering bodies. The first light control pattern CCP-R may contain the first quantum dots and scattering bodies, the third light control pattern CCP-G may contain the second quantum dots and scattering bodies, and the second light control pattern CCP-B may not contain quantum dots and may contain scattering bodies.

Each of the first light control pattern CCP-R, the second light control pattern CCP-B, and the third light control pattern CCP-G may contain a base resin that disperses the quantum dots and the scattering bodies. In an embodiment, the first light control pattern CCP-R may contain the first quantum dots and the scattering bodies dispersed in the base resin, the third light control pattern CCP-G may contain the second quantum dots and the scattering bodies dispersed in the base resin, and the second light control pattern CCP-B may contain the scattering bodies dispersed in the base resin.

The light control layer CCL includes the barrier layer CAP disposed on one surface of the light control layer CCL. The light control layer CCL may include the barrier layer CAP adjacent to the display element layer DP-LED and the additional barrier layer CAP-T spaced apart from the display element layer DP-LED with the light control patterns CCP-R, CCP-G, and CCP-B therebetween.

The optical structure layer OSL in the display panel DP includes the color filter layer CFL disposed on the light control layer CCL. The color filter layer CFL may include color filters CF1, CF2, and CF3. The color filter layer CFL may include the first color filter CF1 that transmits the first light, the second color filter CF2 that transmits the source light, and the third color filter CF3 that transmits the second light. In an embodiment, the first color filter CF1 may be a red filter, the second color filter CF2 may be a blue filter, and the third color filter CF3 may be a green filter.

Each of the filters CF1, CF2, and CF3 contains a photosensitive polymer resin and a colorant (e.g., pigment or dye). The first color filter CF1 may contain a red colorant, the second color filter CF2 may contain a blue colorant, and the third color filter CF3 may contain a green colorant. The first color filter CF1 may contain a red pigment or a red dye, the second color filter CF2 may contain a blue pigment or a blue dye, and the third color filter CF3 may contain a green pigment or a green dye.

The first to third color filters CF1, CF2, and CF3 may be disposed to correspond to the first pixel area PXA-R, the second pixel area PXA-B, and the third pixel area PXA-G, respectively. Furthermore, the first to third color filters CF1, CF2, and CF3 may be disposed to correspond to the first to third light control patterns CCP-R, CCP-B, and CCP-G, respectively.

The plurality of color filters CF1, CF2, and CF3, which transmit different light, may be disposed to overlap each other to correspond to the peripheral area NPXA disposed between the pixel areas PXA-R, PXA-B, and PXA-G. The plurality of color filters CF1, CF2, and CF3 may be disposed to overlap each other in the third direction DR3, which is the thickness direction, to distinguish the borders between the adjacent emissive areas PXA-R, PXA-B, and PXA-G. In some embodiments, unlike in FIG. 2C, the color filter layer CFL may include a light blocking portion that distinguishes the borders between the adjacent color filters CF1, CF2, and CF3. The light blocking portion may be formed of a blue filter, or may be formed of an organic light blocking material or an inorganic light blocking material that contains a black pigment or a black dye.

The color filter layer CFL may include the low refractive index layer LR. The low refractive index layer LR may be disposed between the light control layer CCL and the color filters CF1, CF2, and CF3 (in the DR3 or thickness direction). The low refractive index layer LR may be disposed on the top of the light control layer CCL and may block or reduce exposure of the light control patterns CCP-R, CCP-B, and CCP-G to moisture/oxygen. Furthermore, the low refractive index layer LR may be disposed between the light control patterns CCP-R, CCP-B, and CCP-G and the color filters CF1, CF2, and CF3 and may function as an optical functional layer that raises light extraction efficiency or prevents incidence of reflected light on the light control layer CCL. The low refractive index layer LR may have a lower refractive index than a layer adjacent thereto.

The low refractive index layer LR may include at least one inorganic layer. For example, the low refractive index layer LR may contain silicon nitride, aluminum nitride, zirconium nitride, titanium nitride, hafnium nitride, tantalum nitride, silicon oxide, aluminum oxide, titanium oxide, tin oxide, cerium oxide, or silicon oxy-nitride, or may include a metal thin film with secured light transmittance. However, without being limited thereto, the low refractive index layer LR may include an organic film. For example, the low refractive index layer LR may contain a polymer resin and inorganic particles. The low refractive index layer LR may include a single layer or a plurality of layers.

In some embodiments, in the display panel DP of an embodiment, the color filters CF1, CF2, and CF3 of the color filter layer CFL may be directly disposed on the light control layer CCL. In this case, the low refractive index layer LR may not be provided.

In an embodiment, the optical structure layer OSL may further include the base layer BL disposed on the color filter layer CFL. The base layer BL may be a member that provides a base surface on which the color filter layer CFL and the light control layer CCL are disposed. The base layer BL may be a glass substrate, a metal substrate, or a plastic substrate. However, without being limited thereto, the base layer BL may be an inorganic layer, an organic layer, or a composite layer. Furthermore, unlike in FIG. 2C, the base layer BL may not be provided in an embodiment.

Figure 4A:
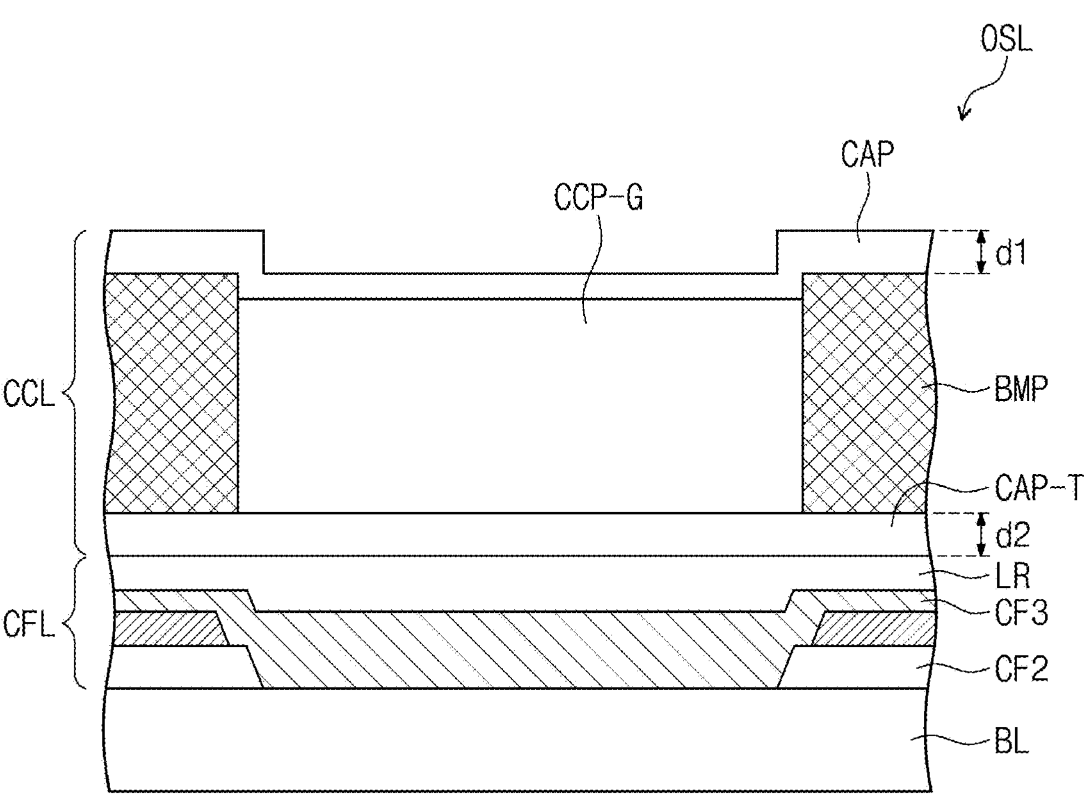
FIGS. 4A and 4B are sectional views illustrating some components of the display panel according to an embodiment of the present disclosure.
Figure 4A:
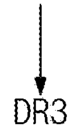
Figure 4B:
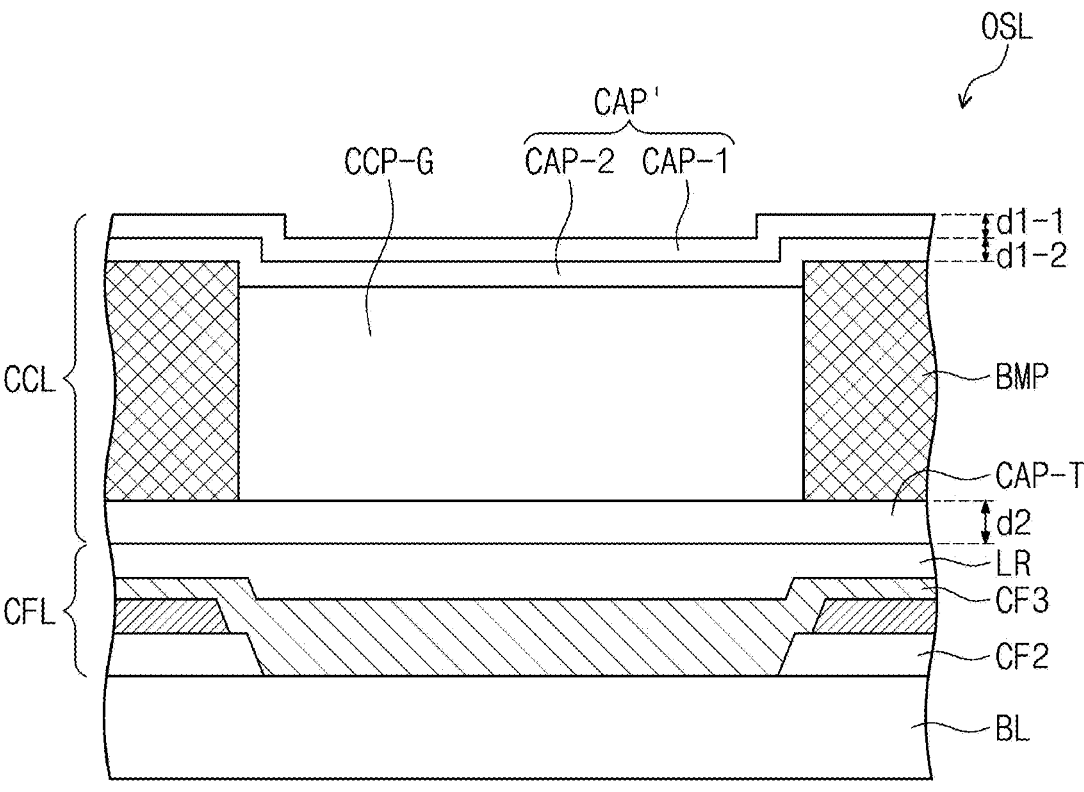

FIGS. 4A and 4B are sectional views illustrating some components of the display panel according to an embodiment of the present disclosure. FIGS. 4A and 4B are enlarged views illustrating some components of the light control layer CCL and the color filter layer CFL included in the optical structure layer OSL of the display panel DP according to the embodiment illustrated in FIG. 2B. FIGS. 4A and 4B illustrate sections that overlap the third light control pattern CCP-G included in the light control layer CCL and the third color filter CF3 included in the color filter layer CFL. In describing the barrier layer CAP and the additional barrier layer CAP-T included in the light control layer CCL of an embodiment with reference to FIGS. 4A and 4B, the third light control pattern CCP-G is referred to as the "light control pattern". In some embodiments, in FIGS. 4A and 4B, the components illustrated in FIG. 2B are illustrated in the state of being rotated by 180 degrees, and based on FIGS. 4A and 4B, a surface located on an upper side will be described as a "lower surface", and a surface located on a lower side will be described as an "upper surface".

Referring to FIGS. 2B and 4A, as described above, the light control layer CCL includes the barrier layer CAP on one surface of the light control pattern CCP-G. The barrier layer CAP may be disposed adjacent to the display element layer DP-LED. For example, the barrier layer CAP may be disposed on the lower surface of the third light control pattern CCP-G.

The barrier layer CAP may be directly disposed on the lower surface of the light control pattern CCP-G and the lower surface of the bank BMP. For example, the barrier layer CAP may make contact with (e.g., directly on or directly below) the lower surface of the light control pattern CCP-G and the lower surface of the bank BMP.

The barrier layer CAP may be disposed between the filling layer FML and the third light control pattern CCP-G. The barrier layer CAP may be directly disposed on the upper surface of the filling layer FML. For example, the barrier layer CAP may make contact with the upper surface of the filling layer FML.

The barrier layer CAP contains silicon oxy-nitride SiON. To prevent or reduce infiltration of moisture/oxygen into the light control pattern CCP-G, raise film durability, and have a refractive index range that does not deteriorate the light efficiency of the display panel, the barrier layer CAP limits the composition ratio of silicon, oxygen, and nitrogen in the silicon oxy-nitride film to a set or predetermined range.

In an embodiment, the silicon oxy-nitride contained in the barrier layer CAP has a composition ratio of about 0.1 atomic % to about 18 atomic % nitrogen, about 42 atomic % to about 70 atomic % oxygen, and about 25 atomic % to about 40 atomic % silicon. The silicon oxy-nitride contained in the barrier layer CAP may have, for example, a composition ratio of about 0.1 atomic % to about 2 atomic % nitrogen, about 58 atomic % to about 70 atomic % oxygen, and about 25 atomic % to about 40 atomic % silicon. The barrier layer CAP has a relatively low nitrogen ratio and thus is characterized in that defects, such as stains and lifting, do not occur and a small amount of outgas is released. Furthermore, as the barrier layer CAP satisfies the composition ratio, the amount of surface moisture adsorption may be decreased, and thus a property of blocking moisture and oxygen may be improved.

In the silicon oxy-nitride contained in the barrier layer CAP, the ratio of oxygen atoms to silicon atoms ranges from about 1.0 to about 2.0. In the silicon oxy-nitride contained in the barrier layer CAP, the ratio of oxygen atoms to silicon atoms may range, for example, from about 1.5 to about 1.9. More specifically, in the silicon oxy-nitride contained in the barrier layer CAP, the ratio of oxygen atoms to silicon atoms may range from about 1.8 to about 1.9. As the barrier layer CAP satisfies the composition ratio, the amount of surface moisture adsorption and the amount of released outgas may be decreased, and thus a property of blocking moisture and oxygen and film durability may be improved.

The thickness d1 of the barrier layer CAP may range from about 2000 Å to about 12000 Å. For example, the barrier layer CAP may have a thickness d1 of about 4000 Å to about 8000 Å. When the thickness d1 of the barrier layer CAP is less than about 2000 Å, a property of blocking moisture and oxygen may be deteriorated so that moisture may infiltrate into the light control pattern CCP-G, and durability may be decreased so that defects, such as lifting or film breakage, may occur. When the thickness d1 of the barrier layer CAP exceeds about 12000 Å, it may be difficult to implement a film having a substantially uniform thickness and composition in a process so that film properties may be deteriorated, and due to the thick barrier layer CAP, stress applied to the optical structure layer OSL may be increased so that damage to the substrate may occur.

The barrier layer CAP may have a refractive index of about 1.4 to about 1.8. The barrier layer CAP may have a refractive index of about 1.4 to about 1.8 for light in the wavelength range of about 400 nm to about 700 nm that is the visible light area. For example, the barrier layer CAP may have a refractive index of about 1.4 to about 1.5 for light in the wavelength range of about 400 nm to about 700 nm. As the barrier layer CAP satisfies the above-described composition ratio of silicon, oxygen, and nitrogen, the barrier layer CAP may have a refractive index of about 1.4 to about 1.8 for light in the wavelength range of about 400 nm to about 700 nm.

The barrier layer CAP may have a lower refractive index than a layer adjacent thereto. The barrier layer CAP may have a lower refractive index than the filling layer FML and the light control pattern CCP-G adjacent thereto.

In an embodiment, the barrier layer CAP may have a lower refractive index than the light control pattern CCP-G adjacent thereto, and the difference between the refractive index of the barrier layer CAP and the refractive index of the light control pattern CCP-G may be less than or equal to about 0.25. In some embodiments, the barrier layer CAP may have the same refractive index as the light control pattern CCP-G adjacent thereto. For example, the barrier layer CAP may have substantially the same refractive index as the light control pattern CCP-G, or the difference between the refractive index of the barrier layer CAP and the refractive index of the light control pattern CCP-G may range from about 0.1 to about 0.2. In some embodiments, when physical properties, such as refractive indexes, are "substantially the same as each other", it may refer to not only that the physical properties are exactly the same as each other, but also that the physical properties are identically designed but there is a slight difference therebetween due to a process error. In an embodiment, the refractive index of the light control pattern CCP-G may range from about 1.6 to about 1.95.

In an embodiment, the barrier layer CAP may have a lower refractive index than the filling layer FML adjacent thereto, and the difference between the refractive index of the barrier layer CAP and the refractive index of the filling layer FML may range from about 0.05 to about 0.1. In some embodiments, the barrier layer CAP may have the same refractive index as the filling layer FML adjacent thereto. For example, the barrier layer CAP may have substantially the same refractive index as the filling layer FML, and the difference between the refractive index of the barrier layer CAP and the refractive index of the filling layer FML may range from about 0.05 to about 0.07. In an embodiment, the refractive index of the filling layer FML may range from about 1.45 to about 1.9.

In an embodiment, the refractive index of the barrier layer CAP may be adjusted to be lower than the refractive index of the light control pattern CCP-G, and the difference between the refractive index of the barrier layer CAP and the refractive index of the light control pattern CCP-G may be adjusted to about 0.1 or more. For example, by adjusting the composition ratio of silicon, oxygen, and nitrogen as described above, the refractive index of the barrier layer CAP may be adjusted to be lower than the refractive index of the light control pattern CCP-G by about 0.1 or more. This may allow for induction of total reflection of light moving from the light control pattern CCP-G toward the barrier layer CAP, and thus it may be possible to recycle the light travelling downward. Accordingly, the light conversion efficiency of the light control pattern CCP-G may be increased, and the display efficiency of the display panel may be improved when the light control pattern CCP-G is applied to the display panel.

In some embodiments, the refractive index of the barrier layer CAP may be adjusted to be lower than the refractive index of the filling layer FML, and the difference between the refractive index of the barrier layer CAP and the refractive index of the filling layer FML may be adjusted to about 0.1 or less. For example, by adjusting the composition ratio of silicon, oxygen, and nitrogen as described above, the refractive index of the barrier layer CAP may be adjusted to be lower than the refractive index of the filling layer FML by about 0.1 or less. Accordingly, the problem in which the path of light travelling from the filling layer FML toward the barrier layer CAP is changed by refraction and total reflection so that the light fails to travel toward the light control pattern CCP-G may be prevented or reduced.

The light control layer CCL according to an embodiment may further include the additional barrier layer CAP-T. The additional barrier layer CAP-T may be disposed between the light control pattern CCP-G and the color filter layer CFL. More specifically, the additional barrier layer CAP-T may be disposed between the light control pattern CCP-G and the low refractive index layer LR.

The additional barrier layer CAP-T may contain silicon oxy-nitride, like the barrier layer CAP. The composition ratio of silicon, oxygen, and nitrogen in the additional barrier layer CAP-T containing the silicon oxy-nitride may be in substantially the same range as the composition ratio of the barrier layer CAP described above. For example, the additional barrier layer CAP-T may contain silicon oxy-nitride and may have a composition ratio of about 0.1 atomic % to about 18 atomic % nitrogen, about 42 atomic % to about 70 atomic % oxygen, and about 25 atomic % to about 40 atomic % silicon. However, without being limited thereto, the additional barrier layer CAP-T may contain silicon oxy-nitride, but may have a composition ratio different from the composition ratio of silicon, oxygen, and nitrogen in the barrier layer CAP. In some embodiments, the additional barrier layer CAP-T may not contain silicon oxy-nitride and may contain silicon oxide or silicon nitride. In another case, the additional barrier layer CAP-T may contain titanium oxide or aluminum oxide.

The additional barrier layer CAP-T may have a lower refractive index than the light control pattern CCP-G adjacent thereto. The refractive index of the additional barrier layer CAP-T may range from about 1.4 to about 1.8. For example, the additional barrier layer CAP-T may have a refractive index of about 1.4 to about 1.5 for light in the wavelength range of about 400 nm to about 700 nm.

In an embodiment, the additional barrier layer CAP-T may have a lower refractive index than the light control pattern CCP-G adjacent thereto, and the difference between the refractive index of the additional barrier layer CAP-T and the refractive index of the light control pattern CCP-G may be less than or equal to about 0.25. In some embodiments, the additional barrier layer CAP-T may have the same refractive index as the light control pattern CCP-G adjacent thereto. For example, the additional barrier layer CAP-T may have substantially the same refractive index as the light control pattern CCP-G, or the difference between the refractive index of the additional barrier layer CAP-T and the refractive index of the light control pattern CCP-G may range from about 0.1 to about 0.2. In an embodiment, the refractive index of the light control pattern CCP-G may range from about 1.6 to about 1.95.

The additional barrier layer CAP-T may have a higher refractive index than the low refractive index layer LR adjacent thereto. In an embodiment, the low refractive index layer LR may have a refractive index of about 1.3 or less for light in the wavelength range of about 400 nm to about 700 nm. The low refractive index layer LR having a low refractive index may raise light extraction efficiency and may prevent or reduce incidence of reflected light on the light control pattern CCP-G. The additional barrier layer CAP-T having a higher refractive index than the low refractive index layer LR adjacent thereto may allow the low refractive index layer LR to have a property of increasing light extraction efficiency and a property of preventing or reducing reflection.

The thickness d2 of the additional barrier layer CAP-T may range from about 2000 Å to about 12000 Å. For example, the additional barrier layer CAP-T may have a thickness d2 of about 4000 Å to about 8000 Å. When the thickness d2 of the additional barrier layer CAP-T is less than about 2000 Å, a property of blocking moisture and oxygen may be deteriorated so that moisture may infiltrate into the light control pattern CCP-G, and durability may be decreased so that defects, such as lifting or film breakage, may occur. When the thickness d2 of the additional barrier layer CAP-T exceeds about 12000 Å, it may be difficult to implement a film having a substantially uniform thickness and composition in a process so that film properties may be deteriorated, and due to the thick additional barrier layer CAP-T, stress applied to the optical structure layer OSL may be increased so that damage to the substrate may occur.

Referring to FIG. 4B, unlike the barrier layer CAP illustrated in FIG. 4A, a barrier layer CAP' of an embodiment may include a plurality of layers. The barrier layer CAP' may include a first sub-barrier layer CAP-1 and a second sub-barrier layer CAP-2 disposed between the first sub-barrier layer CAP-1 and the light control pattern CCP-G. The first sub-barrier layer CAP-1 may be spaced apart from the light control pattern CCP-G and the bank BMP with the second sub-barrier layer CAP-2 therebetween, and the second sub-barrier layer CAP-2 may make contact with (e.g., directly on or directly below) the lower surface of the light control pattern CCP-G and the lower surface of the bank BMP.

The first sub-barrier layer CAP-1 may contain silicon oxy-nitride. The first sub-barrier layer CAP-1 may be a layer that meets the above-described limited range of the composition ratio of silicon, oxygen, and nitrogen. In an embodiment, the first sub-barrier layer CAP-1 may have a composition ratio of about 0.1 atomic % to about 18 atomic % nitrogen, about 42 atomic % to about 70 atomic % oxygen, and about 25 atomic % to about 40 atomic % silicon.

The second sub-barrier layer CAP-2 may be a layer for improving adhesion to the light control pattern CCP-G. The second sub-barrier layer CAP-2 may be a layer having higher adhesion to the light control pattern CCP-G and the bank BMP than the first sub-barrier layer CAP-1. In an embodiment, the second sub-barrier layer CAP-2 may contain silicon oxide. In some embodiments, the second sub-barrier layer CAP-2 may be a mixed layer containing both (e.g., simultaneously) silicon oxide and silicon oxy-nitride.

The thickness d1-2 of the second sub-barrier layer CAP-2 may be smaller than the thickness d1-1 of the first sub-barrier layer CAP-1. In an embodiment, the thickness d1-2 of the second sub-barrier layer CAP-2 may range from about 50 Å to about 200 Å. The thickness d1-1 of the first sub-barrier layer CAP-1 may range from about 1800 Å to about 11800 Å. For example, the first sub-barrier layer CAP-1 may have a thickness d1-1 of about 4000 Å to about 8000 Å, and the second sub-barrier layer CAP-2 may have a thickness d1-2 of about 80 Å to about 120 Å. When the thickness of the second sub-barrier layer CAP-2 is less than about 80 Å, an effect of improving an adhesive force may not be implemented, and when the thickness of the second sub-barrier layer CAP-2 exceeds about 200 Å, the optical characteristics of the entire barrier layer CAP' may be changed due to the second sub-barrier layer CAP-2 so that the optical characteristics of the light control pattern CCP-G disposed on the barrier layer CAP' may be lowered.

Figure 5A:
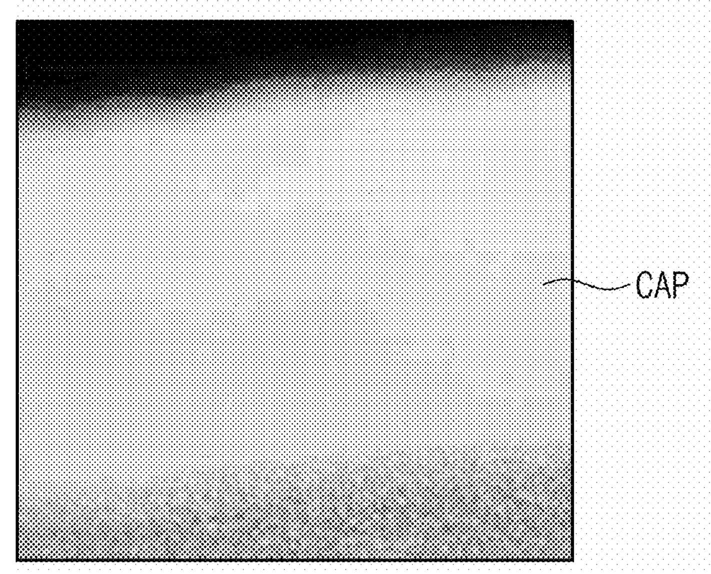
FIG. 5A is a microscope image of a barrier layer according to an embodiment of the present disclosure.
Figure 5B:
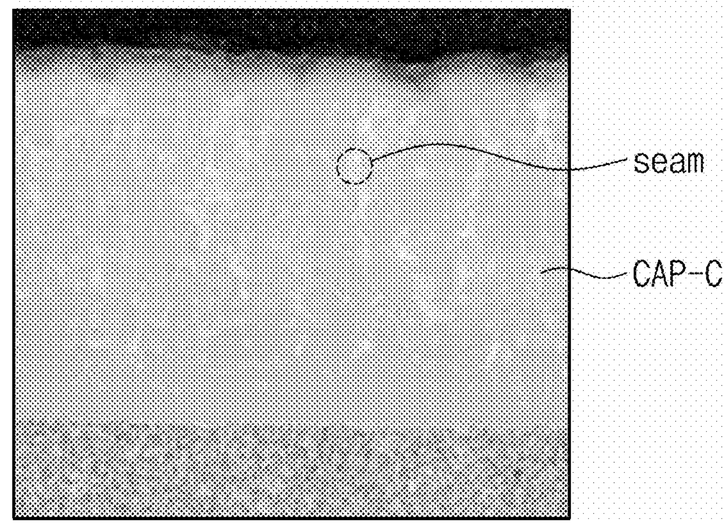
FIG. 5B is a microscope image of a barrier layer according to a comparative example.

FIG. 5A is a microscope image of the barrier layer according to an embodiment of the present disclosure. FIG. 5B is a microscope image of a barrier layer according to a comparative example.

FIG. 5A illustrates a transmission electron microscope (TEM) image of the barrier layer CAP that meets the composition ratio of silicon, oxygen, and nitrogen in the silicon oxy-nitride film according to an embodiment of the present disclosure. In the barrier layer CAP according to the embodiment, the silicon oxy-nitride film is composed of about 34.8 atomic % silicon, about 64.8 atomic % oxygen, and about 0.40 atomic % nitrogen.

FIG. 5B illustrates a TEM image of the barrier layer CAP-C according to the comparative example that includes a silicon oxy-nitride film deviating from the composition range according to an embodiment of the present disclosure. In the barrier layer CAP-C according to the comparative example, the silicon oxy-nitride film is composed of about 38.0 atomic % silicon, about 44.5 atomic % oxygen, and about 17.5 atomic % nitrogen.

When the images illustrated in FIGS. 5A and 5B are compared, it can be seen that in the case of the barrier layer CAP according to the embodiment, the substantially uniform single film was formed without a seam, but in the barrier layer CAP-C according to the comparative example, the seam was formed and the somewhat non-substantially uniform film was formed. In the barrier layer CAP-C according to the comparative example, due to the seam formed in the film when the film was formed through a chemical vapor deposition (CVD) process, external moisture may be easy to infiltrate, and a large amount of outgas may be released in a subsequent process.

In the case of the barrier layer CAP according to an embodiment of the present disclosure, the single silicon oxy-nitride film having excellent or suitable film properties may be formed without a seam. Accordingly, a property of blocking moisture and oxygen may be excellent or suitable, a small amount of outgas may be released, and due to excellent or suitable film durability, defects such as denaturing and cracking of the film caused by external factors may be prevented or reduced. In some embodiments, in the case of the barrier layer CAP according to the embodiment, by adjusting the composition ratio of silicon, oxygen, and nitrogen, the refractive index of the barrier layer CAP may be adjusted to correspond to the refractive index of an adjacent layer, and thus the light conversion efficiency of the light control pattern may be improved. Accordingly, the reliability and display efficiency of the optical structure layer OSL and the display panel DP that include the barrier layer CAP according to the embodiment of the present disclosure may be increased.

According to the display panel of an embodiment of the present disclosure, a property of blocking moisture and oxygen by the barrier layer included in the light control layer and the film durability of the barrier layer may be improved, and the light conversion efficiency of the light control layer including the barrier layer may be enhanced. Accordingly, the reliability and display efficiency of the display panel including the light control layer may be enhanced.

While the present disclosure has been described with reference to embodiments thereof, it will be apparent to those of ordinary skill in the art that one or more suitable changes and modifications may be made thereto without departing from the spirit and scope of the present disclosure as set forth in the following claims and equivalents thereof.

As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof.

As used herein, expressions such as “at least one of a, b or c”, “at least one selected from a, b and c”, “at least one selected from the group consisting of a, b and c”, etc., may indicate only a, only b, only c, both (e.g., simultaneously) a and b, both (e.g., simultaneously) a and c, both (e.g., simultaneously) b and c, all of a, b, and c, or variations thereof.

Spatially relative terms, such as “beneath”, “below”, “lower”, “under”, “above”, “upper” and the like, may be used herein for ease of description to describe one element or feature’s relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as “below” or “beneath” or “under” other elements or features would then be oriented “above” the other elements or features. Thus, the example terms “below” and “under” can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being “between” two layers, it can be the only layer between the two layers, or one or more intervening layers may also be present.

It will be understood that when an element or layer is referred to as being “on”, “connected to”, “coupled to”, or “adjacent to” another element or layer, it can be directly on, connected to, coupled to, or adjacent to the other element or layer, or one or more intervening elements or layers may be present. In contrast, when an element or layer is referred to as being “directly on,” “directly connected to”, “directly coupled to”, or “immediately adjacent to” another element or layer, there are no intervening elements or layers present.

As used herein, the term “substantially,” “about,” and similar terms are used as terms of approximation and not as terms of degree, and are intended to account for the inherent deviations in measured or calculated values that would be recognized by those of ordinary skill in the art. “About” or “substantially”, as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” or “substantially” may mean within one or more standard deviations, or within ±30%, 20%, 10%, 5% of the stated value.

Also, any numerical range recited herein is intended to include all subranges of the same numerical precision subsumed within the recited range. For example, a range of “1.0 to 10.0” is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Although certain embodiments and implementations have been described herein, other embodiments and modifications will be apparent from this description. Accordingly, the present disclosure is not limited to such embodiments, but rather to the broader scope of the appended claims and one or more suitable obvious modifications and equivalent arrangements as would be apparent to a person of ordinary skill in the art.

What is claimed is:

1. A display panel comprising: a light emitting element configured to output source light, the light emitting element comprising a first electrode, an emissive layer over the first electrode, and a second electrode over the emissive layer; and a light control layer over the light emitting element, wherein the light control layer comprises: at least one light control pattern; and a barrier layer on one surface of the light control pattern, the barrier layer comprising silicon oxy-nitride (SiON), and wherein the barrier layer consists of nitrogen, oxygen, and silicon, and the barrier layer is free of hydrogen, and wherein the barrier layer comprises about 0.1 atomic % to about 18 atomic % nitrogen, about 42 atomic % to about 70 atomic % oxygen, and about 25 atomic % to about 45 atomic % silicon.

2. The display panel of claim 1, wherein the barrier layer has a refractive index of about 1.4 to about 1.8.

3. The display panel of claim 1, wherein a difference between a refractive index of the barrier layer and a refractive index of the light control pattern is less than or equal to about 0.25.

4. The display panel of claim 1, wherein the barrier layer has a thickness of about 2000 Å to about 12000 Å.

5. The display panel of claim 1, wherein the barrier layer is between the light emitting element and the light control pattern.

6. The display panel of claim 1, further comprising:

an additional barrier layer spaced apart from the light emitting element with the light control pattern therebetween, wherein the additional barrier layer comprises silicon oxy-nitride.

7. The display panel of claim 1, further comprising:

a color filter layer over the light control layer, the color filter layer comprising at least one color filter configured to overlap the at least one light control pattern.

8. The display panel of claim 7, wherein the color filter layer further comprises a low refractive index layer between the light control pattern and the color filter, and wherein the low refractive index layer has a refractive index of about 1.3 or less.

9. The display panel of claim 1, further comprising:

a filling layer between the light emitting element and the light control layer.

10. The display panel of claim 1, wherein the barrier layer comprises:

a first sub-barrier layer comprising silicon oxy-nitride and comprising about 0.1 atomic % to about 18 atomic % nitrogen, about 42 atomic % to about 70 atomic % oxygen, and about 25 atomic % to 45 atomic % silicon; and a second sub-barrier layer between the first sub-barrier layer and the light control pattern.

11. The display panel of claim 1, wherein the light control pattern comprises a first light control pattern configured to convert the source light into a first light and a second light control pattern configured to transmit the source light, and wherein the first light control pattern comprises a first quantum dot configured to convert the source light into the first light.

12. The display panel of claim 1, wherein the light control pattern is provided in plurality, and the light control layer further comprises a bank between the light control patterns.

13. The display panel of claim 12, wherein the barrier layer is directly on the one surface of each of the light control patterns and one surface of the bank.

14. The display panel of claim 1, wherein the light emitting element comprises a plurality of light emitting stacks between the first electrode and the second electrode, each light emitting stack comprising the emissive layer.

15. The display panel of claim 14, wherein the plurality of light emitting stacks include:

a first light emitting stack on the first electrode, the first light emitting stack comprising a first emissive layer;

a charge generation layer on the first light emitting stack; and a second light emitting stack on the charge generation layer, the second light emitting stack comprising a second emissive layer, and wherein the first emissive layer is configured to emit light having a different color from light emitted from the second emissive layer.

16. A display panel comprising: a light emitting element configured to output source light, the light emitting element comprising a first electrode, an emissive layer over the first electrode, and a second electrode over the emissive layer; and a light control layer over the light emitting element, wherein the light control layer comprises: at least one light control pattern; and a barrier layer on at least one surface of the light control pattern, the barrier layer comprising silicon oxy-nitride (SiON), wherein the barrier layer consists of nitrogen, oxygen, and silicon, and the barrier layer is free of hydrogen, and wherein in the barrier layer, a ratio of oxygen atoms to silicon atoms ranges from about 1.0 to about 2.0, and wherein the barrier layer has a refractive index of about 1.4 to about 1.8.

17. The display panel of claim 16, wherein the barrier layer has a thickness of about 2000 Å to about 12000 Å.

18. A display panel comprising: a lower panel comprising a display element layer and an encapsulation layer on the display element layer; an upper panel over the lower panel; and a filling layer between the lower panel and the upper panel, wherein the upper panel comprises a light control layer on the filling layer, wherein the light control layer comprises: at least one light control pattern; and a barrier layer on at least one surface of the light control pattern, the barrier layer comprising silicon oxy-nitride (SiON), wherein the barrier layer consists of nitrogen, oxygen, and silicon, and the barrier layer is free of hydrogen, wherein in the barrier layer, a ratio of oxygen atoms to silicon atoms ranges from about 1.0 to about 2.0, and wherein a difference between a refractive index of the barrier layer and a refractive index of the light control pattern is less than or equal to about 0.25.

19. The display panel of claim 18, wherein the filling layer has a refractive index of about 1.45 to about 1.9.

20. The display panel of claim 18, wherein a difference between the refractive index of the barrier layer and a refractive index of the filling layer is less than or equal to about 0.1.

* * * * *